(12) United States Patent
Shimizu

(10) Patent No.: US 7,236,899 B1
(45) Date of Patent: Jun. 26, 2007

(54) MICRO-MAGNETIZATION ANALYSIS PROGRAM, METHOD, AND APPARATUS

(75) Inventor: Koichi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/442,978

(22) Filed: May 31, 2006

(30) Foreign Application Priority Data

Feb. 10, 2006 (JP) ............................. 2006-033640

(51) Int. Cl.
*G01R 21/06* (2006.01)
*G06F 19/00* (2006.01)

(52) U.S. Cl. .................... 702/66; 702/112; 702/124; 324/76.12

(58) Field of Classification Search ................... 702/66
See application file for complete search history.

(56) References Cited

FOREIGN PATENT DOCUMENTS

| JP | 06-006502 | 1/1994 |
|----|-----------|--------|
| JP | 11-296504 | 10/1999 |
| JP | 2003-030805 | 1/2003 |

*Primary Examiner*—Michael Nghiem
*Assistant Examiner*—Sujoy Kundu
(74) *Attorney, Agent, or Firm*—Staas & Halsey LLP

(57) ABSTRACT

A micro-magnetization analysis program, method, and apparatus which can analyze transitional change of a micro-magnetization state while one of a plurality of magnetic substances such as a recording medium and a recording head is moved in an arbitrary direction. An input unit reads an analysis object model in which merely regions of a magnetic substance fixed in a space and a magnetic substance to be moved are subjected to mesh-division into minute elements and analysis conditions. A magnetic field distribution calculating unit generates a first magnetic field equation, generates a second magnetic field equation, and solves the simultaneous equations thereof.

20 Claims, 19 Drawing Sheets

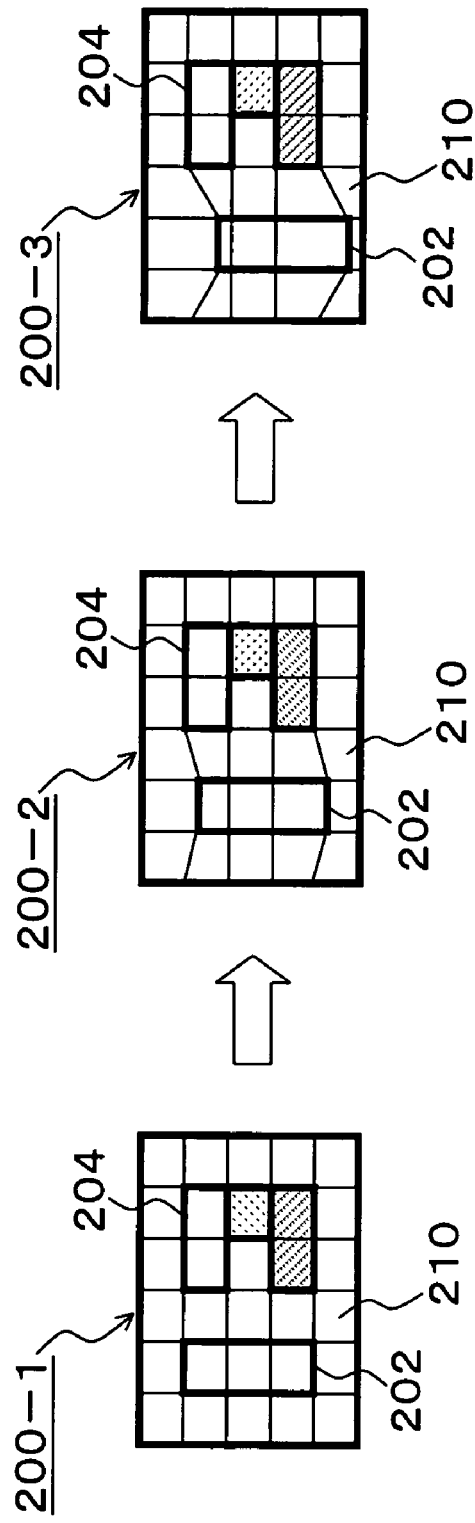

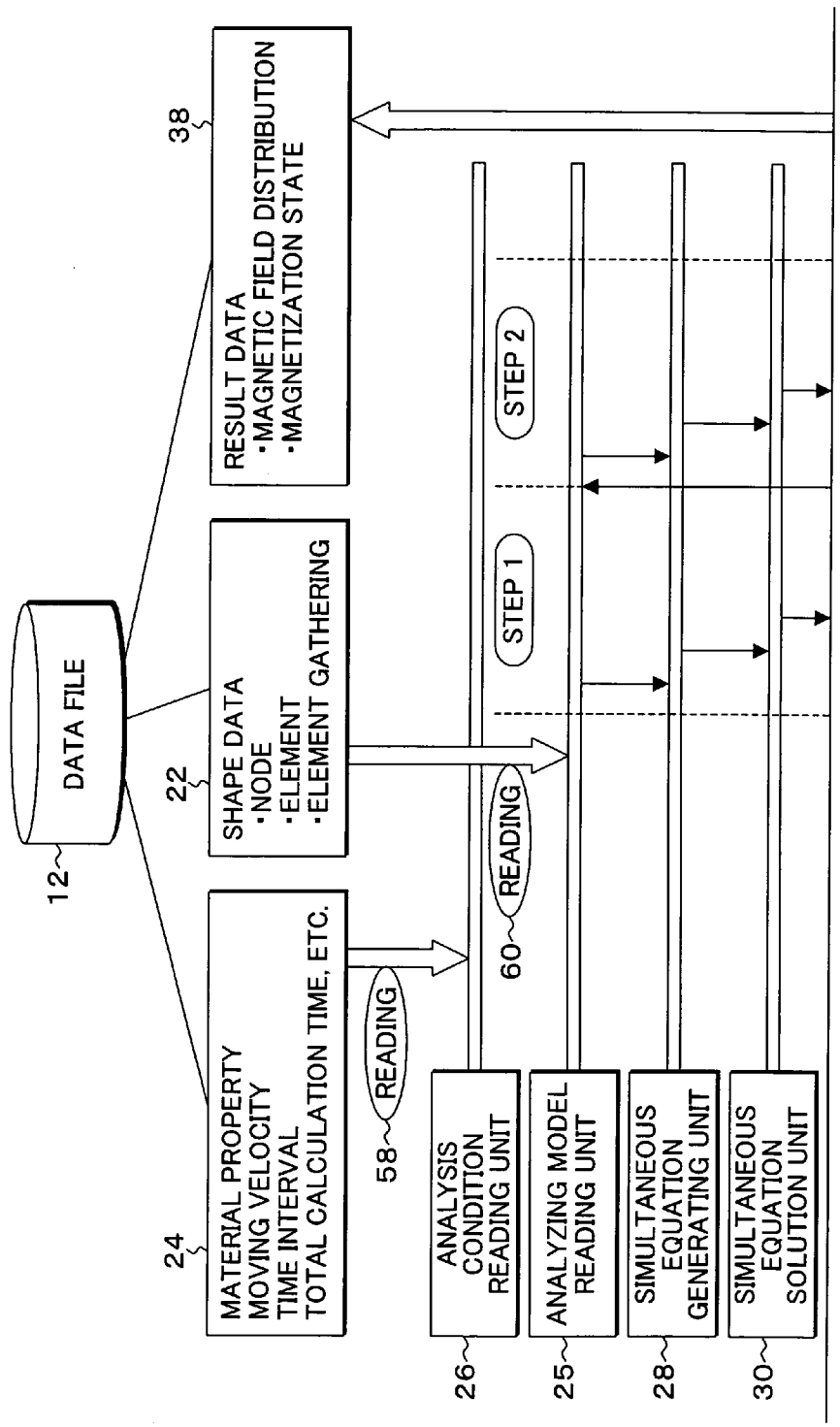

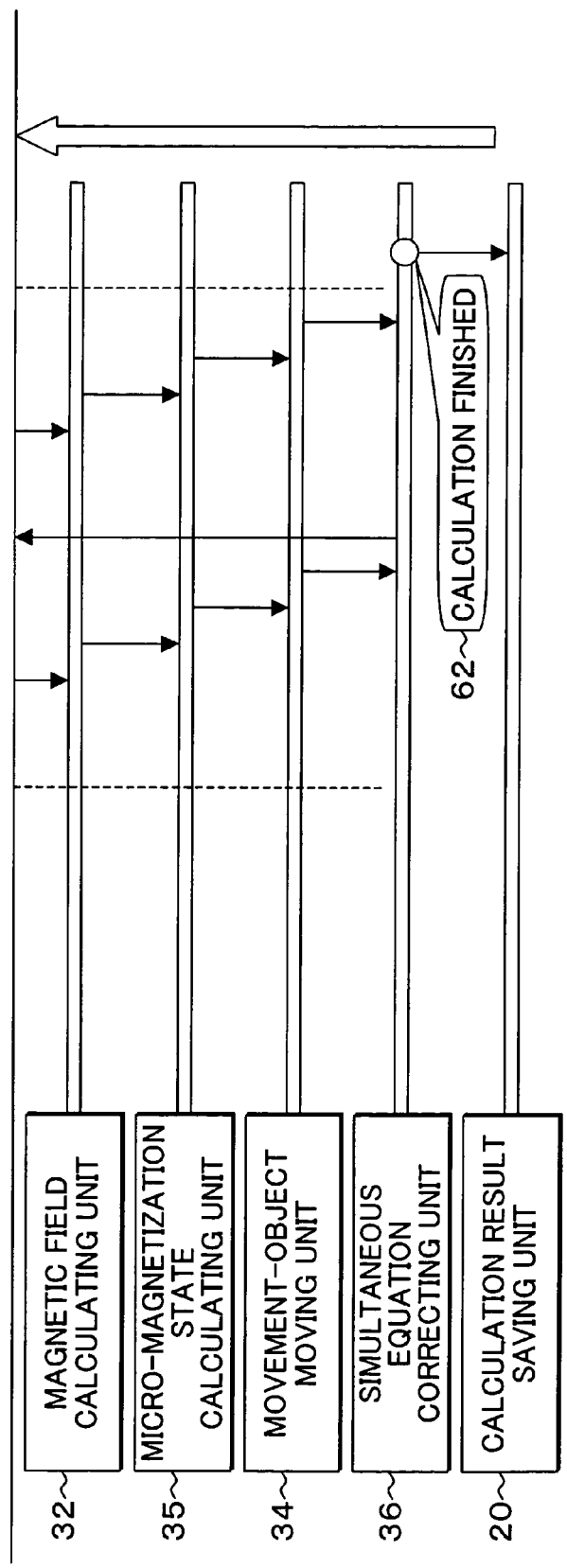

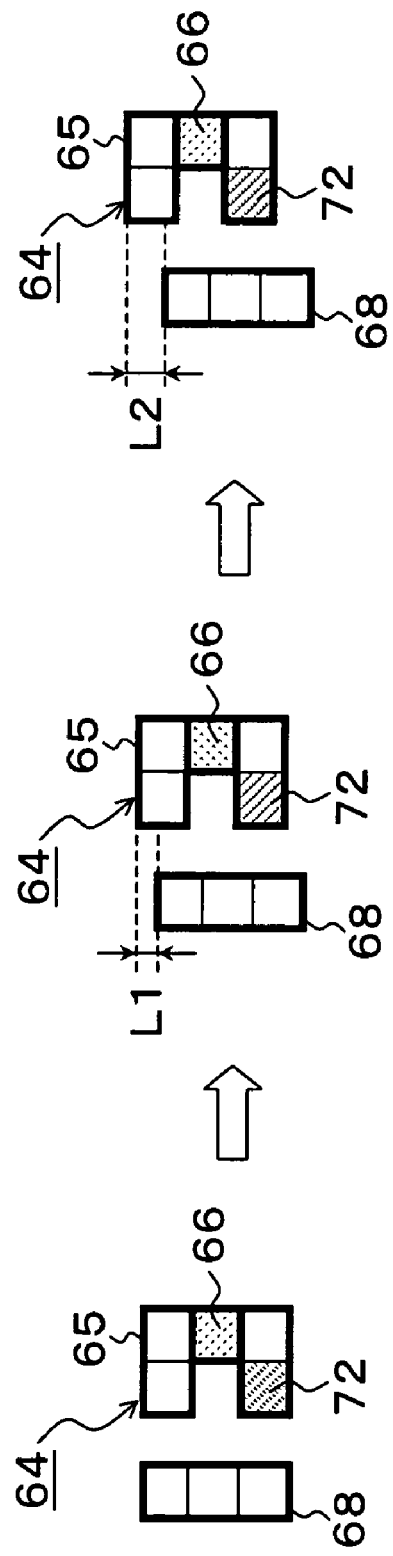

FIG. 15A

SETTING OF GROUP CONDITIONS (MICRO-MAGNETIZATION ANALYSIS)

No= 2 ~104    NAME= US ~106

108 — MATERIAL SELECTION
- NO SETTING
- AIR
- CONDUCTOR
- MAGNETIC SUBSTANCE
- MICRO-MAGNETIZATION

OPTION

EXCITATION CURRENT  110
NON-LINEAR ~112   MAGNETIZE ~114
QUASI-STATIONARY MAGNETIZATION FIXING ~116

118 — MAGNETIC PERMEABILITY         1.000E+00
120 — DIELECTRIC CONSTANT (1/Ωm)    1.000E+00
122 — MAGNETIZING INTENSITY (T)     0.000E+00
124 ┌ MAGNETIZING X-COMPONENT       0.000E+00
    │ MAGNETIZING Y-COMPONENT       0.000E+00
    └ MAGNETIZING Z-COMPONENT       0.000E+00
126 — ID FOR QUASI-STATIONARY CALCULATION   0
128 — MAGNETIZING INTENSITY DIVISION NUMBER 0

OK        CANCEL

SETTING OF BOUNDARY CONDITIONS (MICRO-MAGNETIZATION ANALYSIS)

No= 1    NAME= F00

BOUNDARY FOR MAGNETIC FIELD CALCULATION
- NO SETTING
- EXTERNAL BOUNDARY
- SYMMETRY BOUNDARY
- POTENTIAL BOUNDARY

Ax= 0.000E+00
Ay= 0.000E+00
Az= 0.000E+00
φ = 0.000E+00
φm= 0.000E+00

BOUNDARY FOR EXCITATION CURRENT
- ELECTRIC POTENTIAL SPECIFICATION (V)
- CURRENT SPECIFICATION (A)  0.000E+00

EXCHANGE INTERACTION
- EXCHANGE INTERACTION
- COEFFICIENT/MAGNETIC FIELD
- EXCHANGE COEFFICIENT (J/m)  0.000E+00

MAGNETIZATION VECTOR FIXATION
- X-DIRECTION FIXING
- Y-DIRECTION FIXING
- Z-DIRECTION FIXING

ID FOR QUASI-STATIONARY CALCULATION  0

OK    CANCEL

MICRO-MAGNETIZATION ANALYSIS PROGRAM, METHOD, AND APPARATUS

This application is a priority based on prior application No. JP 2006-033640, filed Feb. 10, 2006, in Japan.

BACKGROUND OF THE INVENTION

1. Field of the Invention

The present invention relates to a micro-magnetization analysis program, method, and apparatus for analyzing a state or change of micro-magnetization of magnetic substances of micron- or nano-order regions; and, particularly relates to a micro-magnetization analysis program, method, and apparatus for analyzing micro-magnetization by using the finite element method and the boundary element method in discretization of two magnetic substances which move relative to each other with respect to, for example, writing or reading of a magnetic head of a hard disk, using the finite volume method in discretization of an LLG equation describing motion of the micro-magnetization, and providing simultaneous equations thereof.

2. Description of the Related Arts

Conventionally, as a micro-magnetization analysis program and analysis apparatus in which, for example, a recording head and a recording medium of a hard disk serve as magnetic substance models, the analysis object model is subjected to mesh-division into minute elements, parameters (unknown values) of micro-magnetization vectors are allocated to the center of the minute elements, and the magnet field distribution of the entire region is calculated by use of the LLG (Landau-Lifshitz-Gilbert) equation as a magnetic field equation. It is an equation which describes motion of micro-magnetization (small magnets) in a magnetic field; and, in the first place, as shown in FIG. 1A, all the regions of a magnetic substance region corresponding to a recording medium 202, a magnetic substance region constituting a recording head 204, a magnetic substance region corresponding to a coil 208, and an air region 210 surrounding the magnetic substance regions in an analysis object model 200 are subjected to mesh-division into minute elements of, for example, several tens to several hundreds nm order. Subsequently, as shown in FIG. 1B, with respect to all of the magnetic substance regions and the air regions 210, vector potentials 214 which are unknown values of equations of the magnetic fields are disposed on sides of mesh-divided minute elements 212, and equations of steady magnetic fields or unsteady magnetic fields are solved by the finite element method. Subsequently, as shown in FIG. 1C, with respect to a micro-magnetization region 206 of FIG. 1A which is treated as micro-magnetization for generating a recording magnetic field, micro-magnetization 216 which is an unknown value M of the LLG equation is disposed at the center of the minute element 212, and the equation of the magnetic field and the LLG equation are alternately solved, thereby calculating a micro-magnetization state for a recording operation of the micro-magnetization region 206.

However, in such conventional magnetic analysis of micro-magnetization regions, since merely the finite element method is used for the equations of the magnetic field, all the magnetic substance regions including the air regions 210 have to be subjected to mesh division, and unknown values of the equations of the magnetic field have to be disposed in all the minute elements. Therefore, minute elements caused by mesh division are present also in the air regions 210 between the magnetic substance regions of the recording medium 202 and the magnetic substance regions constituting the recording head 204, thereby leading to a problem that numerical analysis of the magnetization state during a recording process cannot be performed while the magnetic substance regions of the recording medium 202 are moved. If the magnetic substance regions of the recording medium 202 which moves are modeled and analyzed, as shown in FIGS. 2A to 2C, a plurality of models 200-1 to 200-3 has to be generated and used, and man-hours of analysis processing increases and processing takes time. In addition, when air regions between magnetic substance regions are to be subjected to mesh-division to generate minute elements in the conventional manner, continuity of the minute elements has to be maintained; therefore, it is difficult to generate a magnetic region having a simple shape such as a recording medium as a model in the vicinity of a magnetic substance region having a complex shape such as a recording head. Furthermore, there is also a problem that, along with movement of the magnetic substance region of the recording medium 202, the mesh shape of the air region 210 between the region and the magnetic substance region of the recording head 204 side is deformed from an initially set rectangle to a trapezoid, and this deformation of the mesh lowers the calculation accuracy.

SUMMARY OF THE INVENTION

According to the present invention is to provide a micro-magnetization analysis program, method, and apparatus which can analyze transitional change of a micro-magnetization state while one of a plurality of magnetic substances such as a recording medium and a recording head is moved in an arbitrary direction.

(Program)

The present invention provides a micro-magnetization analysis program executed by a computer. The micro-magnetization analysis program of the present invention is characterized by causing a computer to execute an input step of inputting an analysis object model in which merely regions of a first magnetic substance fixed in a space to be analyzed and a second magnetic substance to be moved are subjected to mesh-division into minute elements and analysis conditions including a material property, a moving velocity, a time step;

a simultaneous equation generating step of generating a first magnetic field equation by use of the finite element method in a state in which unknown values are disposed on sides of all the minute elements of the first magnetic substance and the second magnetic substance and generating a second magnetic field equation by use of the boundary element method in a state in which unknown values are disposed on the sides of boundaries of the minute elements of the first magnetic substance and the second magnetic substance which are in contact with space;

a simultaneous equation solution step of obtaining vector potentials of the sides of the minute elements by solving simultaneous equations based on the first magnetic field equation and the second magnetic field equation;

a magnetic field calculating step of obtaining magnetic field distribution in each of the elements from the vector potentials;

a micro-magnetization motion calculating step of obtaining micro-magnetization by time integration of an LLG equation wherein the magnetic field distribution obtained in the magnetic field calculating step serves as an external magnetic field with respect to the LLG equation in a state in which an unknown value of the micro-magnetization is disposed at the center of each of the minute elements included in a specified micro-magnetization region of the first magnetic substance and/or the second magnetic substance; and a simultaneous equation correcting step of, if a convergence condition of the micro-magnetization obtained in the micro-magnetization motion calculating step is not satisfied, correcting the first magnetic field equation and the second magnetic field equation by use of the micro-magnetization to increase time stepwise, and then, repeating the magnetic field distribution calculating step and the micro-magnetization motion calculating step until the convergence condition is satisfied.

Herein, the magnetic field equation of the finite element method in the simultaneous equation generating step is an unsteady equation. The magnetic field equation of the finite element method in the simultaneous equation generating step may be a steady equation. The unknown values in the simultaneous equation generating step may be disposed on the sides and nodes of the minute elements and the center of each element.

The micro-magnetization analysis program of the present invention is characterized by further executing a movement-object moving step of analyzing transitional change of the micro-magnetization by repeating the process of the simultaneous equation generating step and the processes following the step while moving the second magnetic substance in an arbitrary direction based on the moving velocity.

In the input step, the second magnetic substance to be moved is selected from a model shape display screen or a model name list, and an initial position and the moving velocity are set. In the input step, surfaces of the magnetic substances may be set as regions automatically treated by the boundary element method. In the input step, a boundary surface to be treated by the boundary element method may be arbitrarily selected from a display screen of magnetic substance shape or a list of boundary names and set.

The fixedly-disposed first magnetic substance of the analysis object model is a recording head, the second magnetic substance to be moved is a recording medium, and transitional change of the micro-magnetization with respect to movement of the recording medium is analyzed wherein a recording magnetic pole region of the recording head and a recording medium region serve as micro-magnetization regions.

The fixedly-disposed first magnetic substance of the analysis object model is a reproducing head, the second magnetic substance to be moved is a recording medium, and transitional change of the micro-magnetization with respect to movement of the recording medium is analyzed wherein a read element region of the reproducing head serves as a micro-magnetization region.

(Method)

The present invention provides a micro-magnetization analysis method. The micro-magnetization analysis method of the present invention is characterized by having an input step of inputting an analysis object model in which merely regions of a first magnetic substance fixed in a space to be analyzed and a second magnetic substance to be moved are subjected to mesh-division into minute elements and analysis conditions including a material property, a moving velocity, a time step;

a simultaneous equation generating step of generating a first magnetic field equation by use of the finite element method in a state in which unknown values are disposed on sides of all the minute elements of the first magnetic substance and the second magnetic substance and generating a second magnetic field equation by use of the boundary element method in a state in which unknown values are disposed on the sides of boundaries of the minute elements of the first magnetic substance and the second magnetic substance which are in contact with space;

a simultaneous equation solution step of obtaining vector potentials of the sides of the elements by solving simultaneous equations based on the first magnetic field equation and the second magnetic field equation;

a magnetic field calculating step of obtaining magnetic field distribution in each of the elements from the vector potentials;

a micro-magnetization motion calculating step of obtaining micro-magnetization by time integration of an LLG equation wherein the magnetic field distribution obtained in the magnetic field calculating step serves as an external magnetic field with respect to the LLG equation in a state in which an unknown value of the micro-magnetization is disposed at the center of each of the minute elements included in a specified micro-magnetization region of the first magnetic substance and/or the second magnetic substance; and a simultaneous equation correcting step of, if a convergence condition of the micro-magnetization obtained in the micro-magnetization motion calculating step is not satisfied, correcting the first magnetic field equation and the second magnetic field equation by use of the micro-magnetization to increase time stepwise, and then, repeating the process of the simultaneous equation generating step and the processes following the step until the convergence condition is satisfied.

(Apparatus)

The present invention provides a micro-magnetization analysis apparatus. The micro-magnetization analysis apparatus is characterized by having an input unit for inputting an analysis object model in which merely regions of a first magnetic substance fixed in a space to be analyzed and a second magnetic substance to be moved are subjected to mesh-division into minute elements and analysis conditions including a material property, a moving velocity, a time step;

a simultaneous equation generating unit for generating a first magnetic field equation by use of the finite element method in a state in which unknown values are disposed on sides of all the minute elements of the first magnetic substance and the second magnetic substance and generating a second magnetic field equation by use of the boundary element method in a state in which unknown values are disposed on the sides of boundaries of the minute elements of the first magnetic substance and the second magnetic substance which are in contact with space;

a simultaneous equation solution unit for obtaining vector potentials of the sides of the elements by solving simultaneous equations based on the first magnetic field equation and the second magnetic field equation;

a magnetic field calculating unit for obtaining magnetic field distribution in each of the elements from the vector potentials;

a micro-magnetization motion calculating unit for obtaining micro-magnetization by time integration of an LLG equation wherein the magnetic field distribution obtained by the magnetic field calculating unit serves as an external magnetic field with respect to the LLG equation in a state in which an unknown value of the micro-magnetization is disposed at the center of each of the minute elements included in a specified micro-magnetization region of the first magnetic substance and/or the second magnetic substance; and a simultaneous equation correcting unit for, if a convergence condition of the micro-magnetization obtained in the micro-magnetization motion calculating step is not satisfied, correcting the first magnetic field equation and the second magnetic field equation by use of the micro-magnetization to increase time partially, and then, repeating the process of the simultaneous equation generating step and the processes following the step until the convergence condition is satisfied.

According to the present invention, when the finite element method and the boundary element method are used in equations of the magnetic field with respect to a conventional micro-magnetization analysis method using the finite element method in the equations of magnetic fields and using the finite volume method in the LLG equation describing motion of micro-magnetization, the process of subjecting an air region between models to mesh division and solving magnetic field equations for each minute element becomes unnecessary, and transitional change of a magnetization state can be analyzed while a model such as a magnetic substance is being moved in an arbitrary direction. When micro-magnetization analysis in which a magnetic substance or the like is moved is to be performed by means of a conventional method, a plurality of models in which a model serving as a movement object is shifted little by little has to be generated in advance, and files have to be sequentially read for performing calculation while saving intermediate processes. However, according to the present invention, transitional magnetic change can be continuously analyzed while moving a particular model among a plurality of models in an arbitrary direction, and calculation time for model generation and magnetization analysis can be significantly shortened since a plurality of models corresponding to movement positions is not required to be generated and analyzed. Furthermore, although the type of mesh shape is limited to merely tetrahedrons or hexahedrons in the conventional method in which all the regions including the space between models are solved by the finite element method due to characteristics of the equations of magnetic fields; in the method of the present invention in which the mesh of the space between the models is not required, since tetrahedrons or hexahedrons can be respectively selected for each model region to generate mesh, micro-magnetization analysis for models having complex shapes is facilitated, and calculation accuracy can be enhanced since mesh quality is improved. The above and other objects, features, and advantages of the present invention will become more apparent from the following detailed description with reference to the drawings.

BRIEF DESCRIPTION OF THE DRAWINGS

FIGS. 2A to 2C are explanatory diagrams of a plurality of models generated in micro-magnetization analysis along with movement of a recording medium;

FIGS. 5A and 5B are explanatory diagrams of a summary of a micro-magnetization analysis operation of FIG. 3;

FIGS. 12A to 12C are explanatory diagrams of micro-magnetization analysis of the present invention which is performed while a recording medium is directly moved;

FIGS. 15A and 15B are explanatory diagrams of a dialogue for analysis condition setting for an element group; and FIG. 16 is an explanatory diagram of an analysis condition setting dialogue for an element boundary.

DETAILED DESCRIPTION OF THE PREFERRED EMBODIMENTS

Figure 1A:
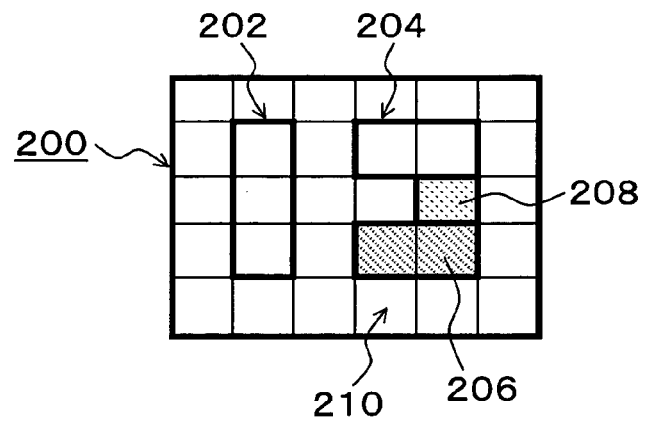
FIGS. 1A to 1C are explanatory diagrams of a conventional analysis object model subjected to micro-magnetization analysis by dividing entire regions into a mesh and disposal of unknown values of magnetic field equations and the LLG equation.
Figure 1B:
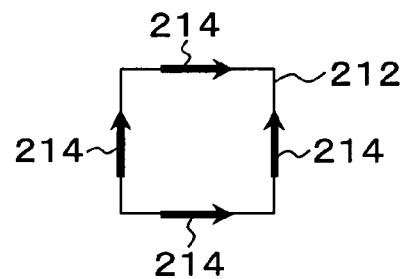
Figure 1C:
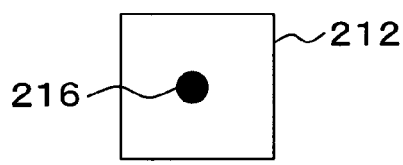
Figure 3:
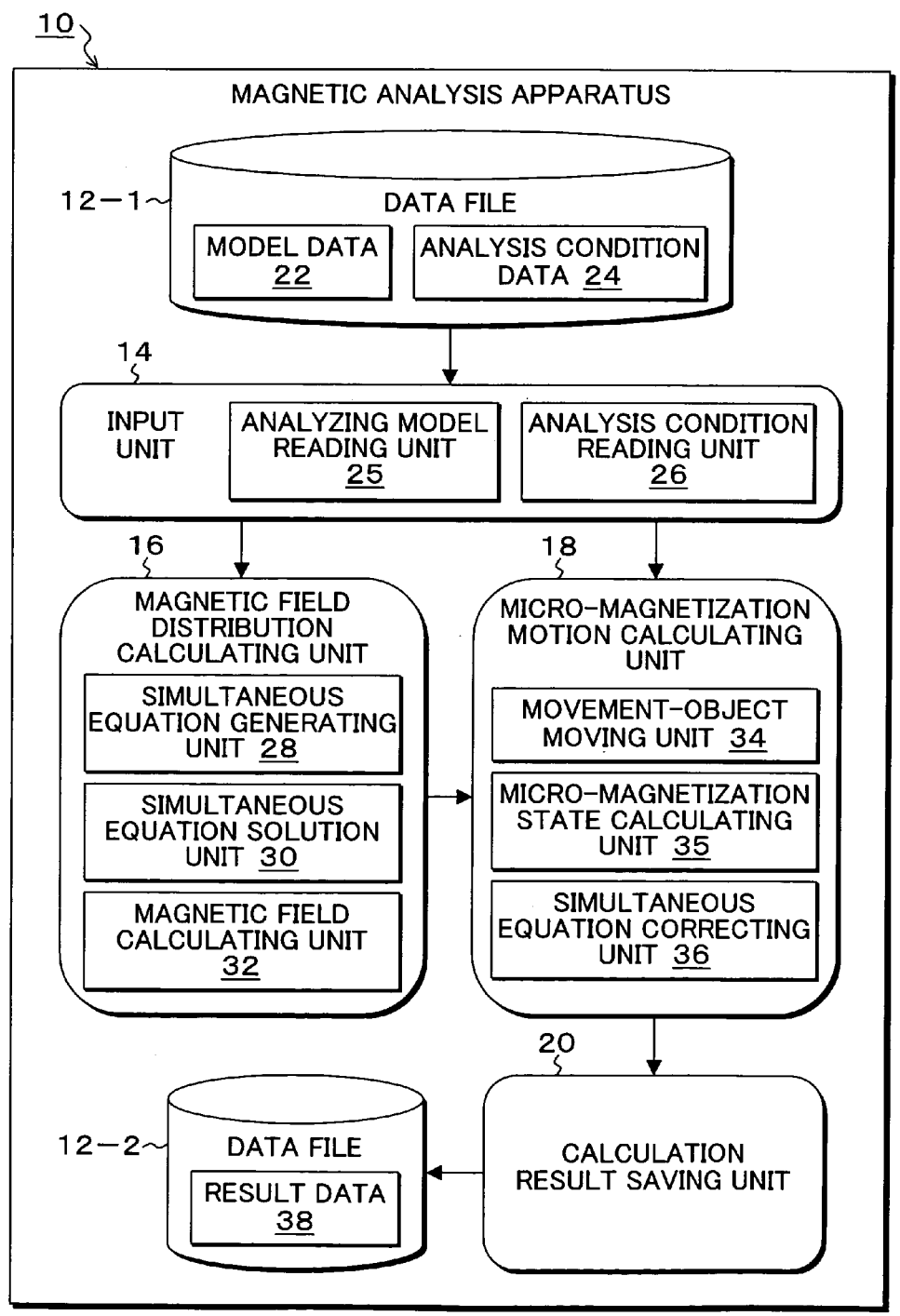
FIG. 3 is a block diagram of a functional configuration of a magnetization analysis apparatus which executes a micro-magnetization analysis program according to the present invention.

FIG. 3 is a block diagram of a functional configuration of a magnetic analysis apparatus which executes a micro-magnetization analysis program according to the present invention. In FIG. 3, in a magnetic analysis apparatus 10, a data file 12-1, an input unit 14, a magnetic field calculating unit 16, a micro-magnetization motion calculating unit 18, a calculation result saving unit 20, and a data file 12-2 are provided. Among these, functions of the input unit 14, the magnetic field distribution calculating unit 16, the micro-magnetization motion calculating unit 18, and the calculation result saving unit 20 are functions which are realized by executing the micro-magnetization analysis program of the present invention by a computer. Model data 22 of an analysis object model and analysis condition data 24 which is necessary for micro-magnetization analysis is stored in the data file 12-1. An analyzing model reading unit 25 and an analysis condition reading unit 26 are provided in the input unit 14. The analyzing model reading unit 25 reads shape data of a model to be analyzed from the model-data 22 of the data file 12-1. In the present invention, as an analysis object model, for example, like a recording medium and a recording head in a hard disk drive, a shape model including a first magnetic substance corresponding to a recording head fixed in space to be analyzed and a second magnetic substance corresponding to a recording medium serving as a moving object is read as an analysis object model. The model shape of the analyzing model has undergone mesh division into minute elements, and the minute elements which have undergone mesh division have a size of, for example, several-ten- to several-hundred-nm order. The analysis condition reading unit 26 reads, as analysis conditions necessary for micro-magnetization analysis, material properties, a moving velocity, a time interval, total calculation time, etc. This reading performed by the analysis condition reading unit 26 is performed by use of dialogues for analysis condition setting illustrated in FIG. 15A, 15B and FIG. 16. A simultaneous equation generating unit 28, a simultaneous equation solution unit 30, and a magnetic field calculating unit 32 are provided in the magnetic field distribution calculating unit 16. Moreover, a movement-object moving unit 34, a micro-magnetization state calculating unit 35, and a simultaneous equation correcting unit 36 are provided in the micro-magnetization motion calculating unit 18. In the micro-magnetization analysis program of the present invention, with respect to an analysis object model in which a stationary model and a moving model are disposed with a space therebetween, the finite element method (FEM) and the boundary element method (BEM) are used in discretization of an equation of a steady magnetic field or equations of an unsteady magnetic field, the finite volume method is used in discretization of an LLG equation describing motion of micro-magnetization, and micro-magnetization analysis is realized by providing respective simultaneous equations. Herein, micro-magnetization analysis is a means for analyzing behavior of magnetic substances such as barriers and axes which dynamically change and a stable state of magnetization by subjecting the magnetic substances to mesh division into minute elements and causing magnetic energy equations of the minute elements to be close to minimum. The present invention uses the LLG equation in this micro-magnetization analysis. The LLG equation is an equation for describing a state in which energy of all the magnetization regions undergoes a transition to a stable state while micro-magnetization of each minute element precesses about a respective effective magnetic field direction serving as a central axis. In this analysis of micro-magnetization by means of the LLG equation, in the present invention, an unknown value of the micro-magnetization is disposed at the center of the minute element, and the finite volume method is used in discretization of the LLG equation to obtain the micro-magnetization. In such a calculation process of micro-magnetization analysis of the present invention, in the magnetic field distribution calculating unit 16, the equations of magnetic fields are discretized by the finite element method and the boundary element method in order to solve the equations of the magnetic fields, and simultaneous equations are generated and solved. Therefore, the simultaneous equation generating unit 28 provided in the magnetic field distribution calculating unit 16 generates a first magnetic field equation by use of the finite element method in a state in which unknown values of magnetic field vectors are disposed at all the minute elements of the first magnetic substance of the stationary side and the second magnetic substance of the moving side in the analysis object model, and a second magnetic field equation is generated by use of the boundary element method in a state in which unknown values of magnetic field vectors are disposed at the sides of boundaries of a minute element which is in contact with the space of the first magnetic substance of the stationary side and the second magnetic substance of the moving side. When the finite element method and the boundary element method are used in this manner in discretization of the magnetic field equations of the two magnetic substances of the analysis object model which are present with a space therebetween, mesh division of the space between the magnetic substances, i.e., an air region becomes unnecessary; and, once the analysis object model is generated, micro-magnetization analysis of every movement position can be performed by use of the same analysis object model by repeating micro-magnetization analysis without modification while the magnetic substance of the moving side is moved in accordance with velocity information. The simultaneous equation solution unit 30 solves the simultaneous equations based on the first magnetic field equations using the finite element method and the second magnetic field equation using the boundary element method which are generated in the simultaneous equation generating unit 28 to obtain vector potentials of sides of each element. The magnetic field calculating unit 32 obtains magnetic field distribution in each element from the vector potentials obtained by the simultaneous equation solution unit 30. The micro-magnetization state calculating unit 35 of the micro-magnetization motion calculating unit 18 specifies a specified micro-magnetization region, for example, a head region having a recording magnetic pole if it is a recording head, as a micro-magnetization region regarding the first magnetic substance of the stationary side and/or the second magnetic substance of the moving side in the analysis object model, and, in a state in which an unknown value of micro-magnetization is disposed at the center of each minute element included in the micro-magnetization region, and obtains the micro-magnetization by time integration of the LLG equation by using the finite volume method in discretization of the LLG equation, wherein the magnetic field distribution obtained by the magnetic field distribution calculating unit 16 serves as an external magnetic field with respect to the LLG equation. When the micro-magnetization obtained by the micro-magnetization state calculating unit 35 does not satisfies a convergence condition in which the energy of the all the magnetization regions converges to a stable state, the simultaneous equation correcting unit 36 corrects the first magnetic field equation and the second magnetic field equations, which are used by the magnetic field distribution calculating unit 16, by use of the micro-magnetization and increases time stepwise, and then, the process from the simultaneous equation solution unit 30 of the magnetic field distribution calculating unit 16 is repeated until the convergence condition is fulfilled. Furthermore, the movement-object moving unit 34 is provided in the micro-magnetization motion calculating unit 18 and repeats the process subsequent to that of the simultaneous equation generating unit 28 in the magnetic field distribution calculating unit 16 while the second magnetic substance, which is the moving side, is moved in a specified direction based on the moving velocity, which has been read as the analysis condition, so as to obtain micro-magnetization for each movement position; thus, transitional change of the micro-magnetization along with movement can be analyzed.

Figure 4:
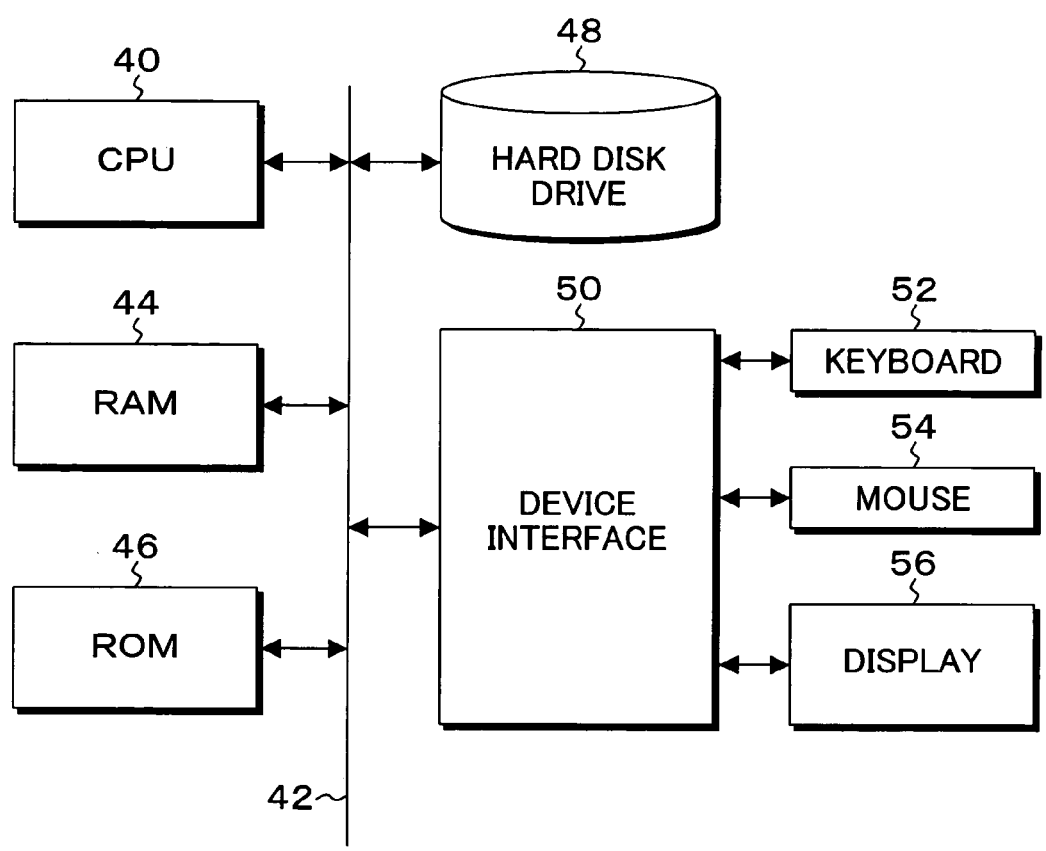
FIG. 4 is a block diagram of a hardware environment of a computer in which the functional configuration of FIG. 3 is built.

FIG. 4 is a block diagram of a hardware environment of a computer in which the functional configuration of the magnetic analysis apparatus 10 of FIG. 3 is built. In FIG. 4, with respect to a bus 42 of a CPU 40, a RAM 44, a ROM 46, a hard disk drive 48, and a device interface 50 connecting a keyboard 52, a mouse 54, a display 56 are provided. The micro-magnetization analysis program of the present invention is installed in the hard disk drive 48; and, after an OS is deployed subsequently to a boot process upon start-up of the computer, when the micro-magnetization analysis program is executed as an application program by operation of, for example, the keyboard 52, it is read out from the hard disk drive 48, deployed in the RAM 44, and executed by the CPU 40.

FIGS. 5A and 5B are explanatory diagrams of a summary of a micro-magnetization analysis operation of the present invention by means of the functional configuration of the magnetic analysis apparatus 10 of FIG. 3. In FIGS. 5A and 5B, in the first place, the analysis condition reading unit 26 reads the analysis condition data 24 stored in the data file 12 by a reading process 58, and, subsequently, the analyzing model reading unit 25 reads the model data 22 stored in the data file 12 by a reading process 60. When reading of the analysis conditions and the analyzing model is finished, a series of micro-magnetization analysis processes shown in step 1 is executed. More specifically, with respect to a plurality of model regions of the model data for analysis, the simultaneous equation generating unit 28 generates simultaneous equations by using the finite element method and the boundary element method in discretization of the equations of the magnetic fields; subsequently, the simultaneous equations are solved by the simultaneous equation solution unit 30 to obtain vector potentials of the minute elements; and the magnetic fields of the minute elements are calculated by the magnetic field calculating unit 32 from the vector potentials. Subsequently, the micro-magnetization state calculating unit 35 obtains unknown values of the micro-magnetization disposed at the center of the minute elements by using the finite volume method in discretization of the LLG equation wherein the magnetic fields of the minute elements obtained from the equations of the magnetic fields serve as external magnetic fields. Herein, if the calculated micro-magnetization satisfies the convergence condition, the movement-object moving unit 34 specifies, based on the moving velocity, a movement position after certain time interval. Since the convergence condition have already been obtained in the micro-magnetization state calculation, without performing correction by the simultaneous equation correcting unit 36, the process returns to the analyzing model reading unit 25 again, and, after a new coordinate position of the moving model is calculated based on the moving velocity, a series of processes shown in step 2 is repeated. When it reaches total time of movement at the point when the process of step 2 is finished, the calculation is finished 62 at this point, and the calculation result is stored in the data file 12 as result data 38 by the calculation result saving unit 20.

Figure 6:
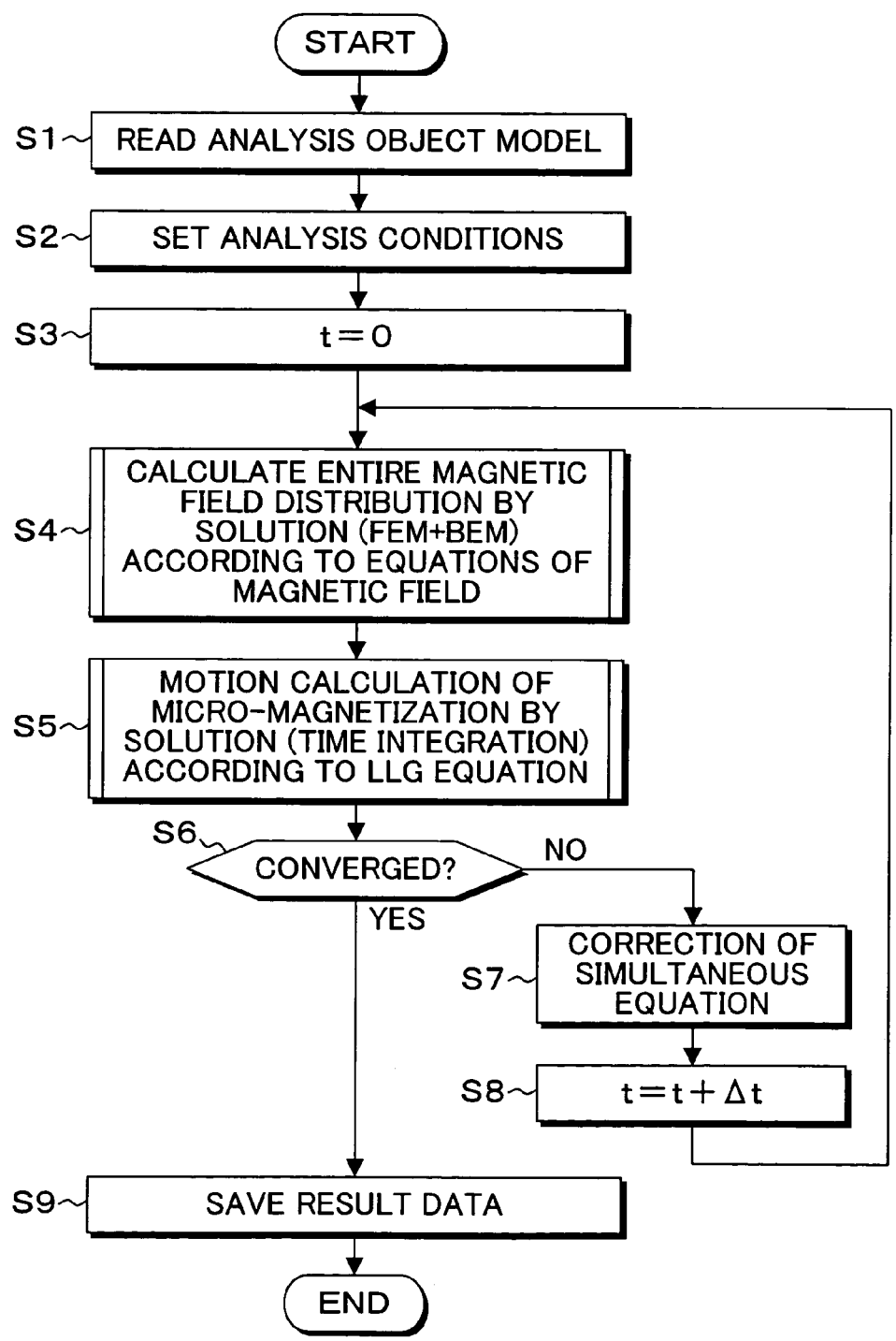
FIG. 6 is a flow chart of the entire process of a magnetization analysis process according to the present invention.
Figure 7:
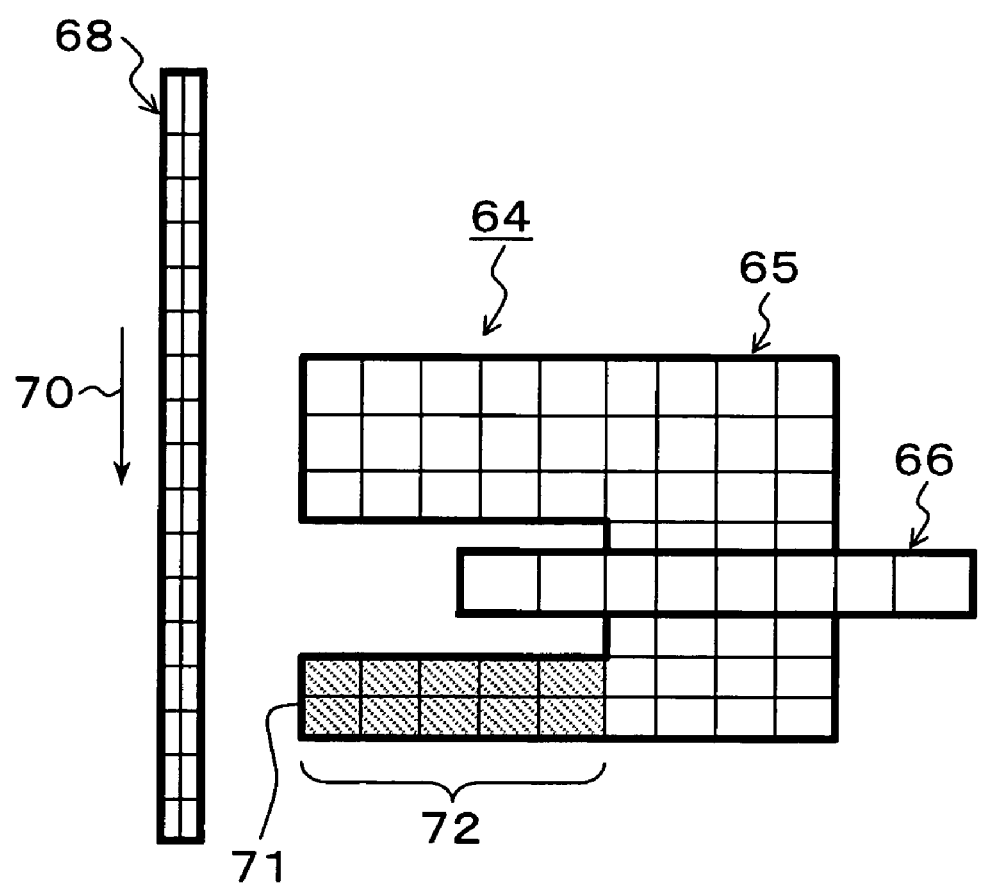
FIG. 7 is an explanatory diagram of an analysis object model read in step S1 of FIG. 6.

FIG. 6 is a flow chart of the entire process of the micro-magnetization analysis program according to the present invention. In the present embodiment, since an external magnetic field with respect to the LLG equation describing motion of the micro-magnetization is obtained, simultaneous equations of magnetic fields are solved by using the finite element method and the boundary element method in discretization of equations of a steady or an unsteady magnetic field, and the accordingly-obtained external magnetic field is applied to the LLG equation to analyze the motion of the micro-magnetization by time integration thereof. In FIG. 6, when the process is started, in the first place, an analysis object model is read in step S1. FIG. 7 is an example of an analysis object model read in the present embodiment.

Figure 15B:
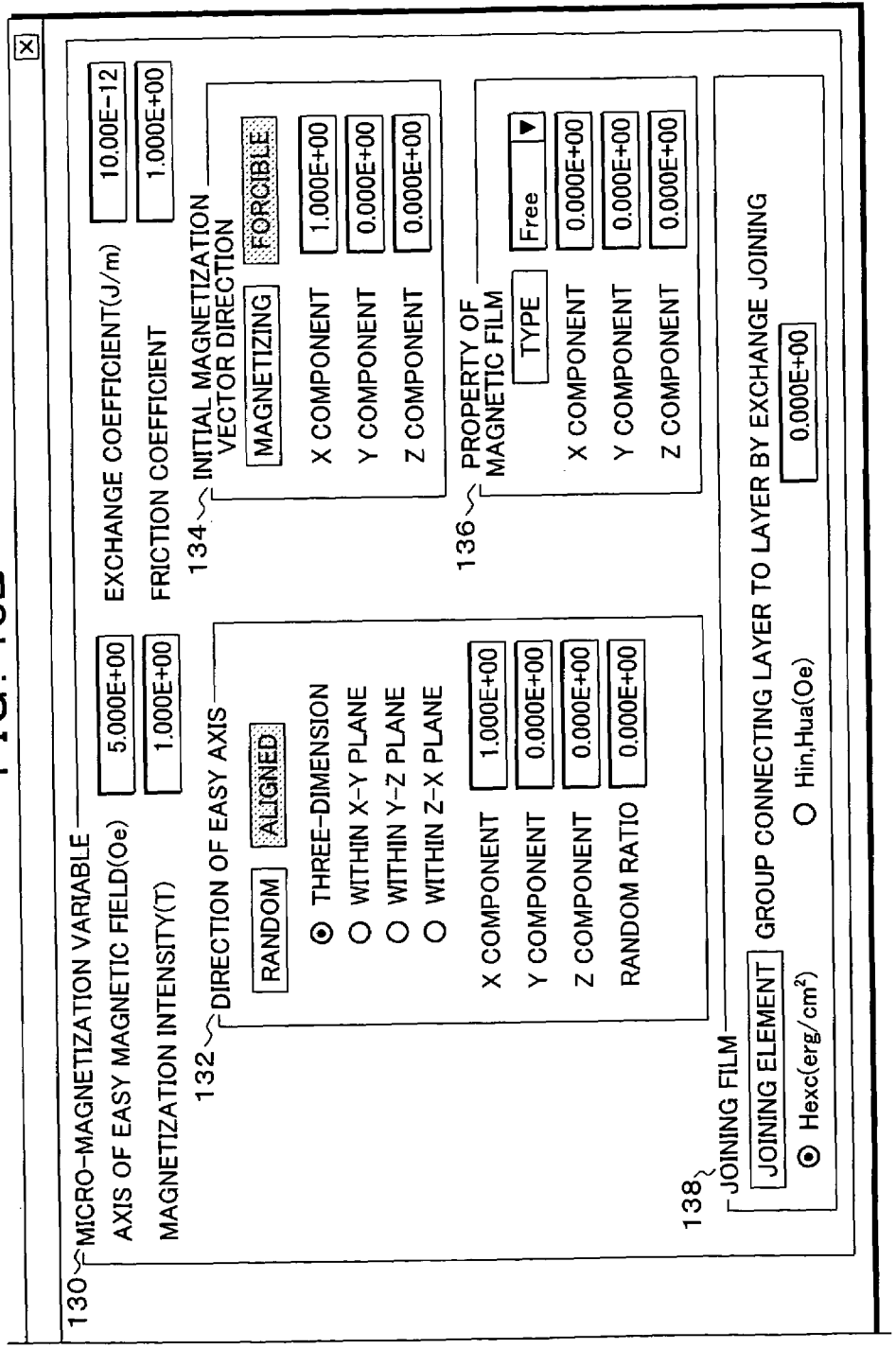

In FIG. 7, the analysis object model is a magnetic field analysis model of a vertical recording head of a hard disk drive (HDD), wherein the vertical recording head 64 is composed of a magnetic pole 65 and a coil 66, a recording medium 68 is disposed with a predetermined air gap between it and the vertical recording head 64, and the recording medium 68 moves in a direction shown by a movement vector 70 at a constant velocity. Regarding the vertical recording head 64 and the recording medium 68 of such an analysis object model, each of the regions has undergone mesh division into minute elements. In addition, in magnetic analysis of the vertical recording head 64, since vertical magnetic recording of the recording medium 68 by a magnetic field from a magnetic pole surface 71 serves as an object, a hatched region which generates the magnetic field at the magnetic pole surface 71 is specified as a micro-magnetization region 72. Referring again to FIG. 6, setting of analysis conditions is performed in next step S2. When the analysis object model of FIG. 7 is taken as an example, the minute elements are separated into groups respectively corresponding to the magnetic pole 65, the coil 66, and the recording medium 68 which are formed of the same materials, and analysis conditions such as material properties, moving velocities, and time intervals are set at one time for the minute elements corresponding to each element group, specifically, the analysis conditions are set by use of dialogues of FIG. 15A, 15B and FIG. 16 for analysis condition setting which will be elucidated in later description. Herein, the analysis condition setting dialogues of FIG. 15A, 15B and FIG. 16 are used in the setting of the analysis conditions of step S2; wherein, since a particular model among the read analysis object models is set as a moving object, a model shape display screen or a model name list is displayed on a display, a model which serves as a moving object, for example, the recording medium 68 in FIG. 7 is selected therefrom, and an initial position and a moving velocity are set. Moreover, in the present invention, the finite element method and the boundary element method are used in discretization of equations of magnetic fields of model regions of analysis object models. Among these, in the model for which the boundary element method is used, boundary edges of the minute elements that are in contact with an air region are basically used as boundary surfaces which are used in the boundary element method, and the region used in the boundary element method of the analysis object model can be automatically set according to the model shape. In addition, in order to enable usage of particular boundary surfaces in the boundary element method, the boundary surfaces used in the boundary element method can be also arbitrarily set by selecting them from a display screen of the shape of an analysis object model or a list of boundary surfaces. When reading of the analysis object model of step S1 and setting of the analysis conditions of step S2 are finished in this manner, time t is initialized to t=0 in step S3. Then, in step S4, with respect to the analysis object model of FIG. 7, magnetic field distribution of all the minute regions, which are obtained by subjecting the magnetic pole 65, the coil 66, and the recording medium 68 to mesh division, is calculated by generating/solving simultaneous equations by means of discretization using the finite element method (FEM) and the boundary element method (BEM) in the equations of the magnetic fields. The following expressions are used as equations of an unsteady magnetic field which uses the finite method and the boundary method in discretization in step S4. Note that symbols of vectors are shown with underlines in the following description.

$$\vec{\nabla} \times (\nu \vec{\nabla} \times \vec{A}) - \vec{J}_0 + \sigma \left( \frac{\partial \vec{A}}{\partial t} + \vec{\nabla} \phi \right) - v_0 \vec{\nabla} \times \vec{M} = 0 \qquad (1)$$

$$\vec{\nabla} \cdot \left\{ -\sigma \left( \frac{\partial \vec{A}}{\partial t} + \vec{\nabla} \phi \right) \right\} = 0 \qquad (2)$$

Wherein, A is a vector potential,
  $j_0$ is a current density of a current,
  $\phi$ is a scalar potential,
  $\sigma$ is an electrical conductivity,
  V is an inverse number of magnetic permeability $\mu$.

Moreover, the equation of a steady magnetic field is provided by the following expression since it is a case in which φ=0 and the magnetic component of the vector potential A is 0 in the equations (1) and (2) of the unsteady magnetic field.

$$\vec{\nabla} \times (v\vec{\nabla} \times \vec{A}) - \vec{J}_0 - v_0 \vec{\nabla} \times \vec{M} = 0 \qquad (3)$$

The unsteady magnetic field equations of the expressions (1) and (2) are used in magnetic field calculation of a case when temporal change of the current is large and used in analysis of a writing magnetic field, for example like FIG. 7, when data is to be written to the recording medium 68 by causing the current to flow through the coil 66 of the vertical recording head 64. On the other hand, the steady magnetic field equation of the expression (3) is used in magnetic field analysis of a case in which a steady current or a current which temporally changes slowly flows through the coil, wherein magnetic field calculation is performed without considering an eddy current due to time change of the magnetic field. Specifically, it is used in analysis of a magnetic field around a reproducing head when a read operation is to be performed in a hard disk drive, that is, magnetic field analysis of a case in which a constant sense current is caused to flow through the reproducing head to control a magnetic field from the recording medium according to change of the sense current.

Figure 8A:
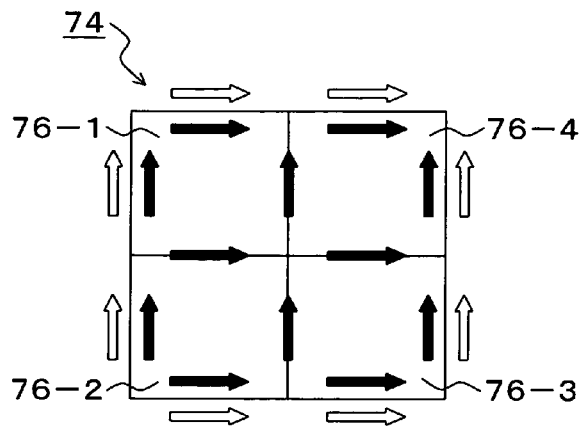
FIGS. 8A to 8C are explanatory diagrams showing setting of unknown values with respect to non-micro-magnetization regions including boundaries.
Figure 8B:
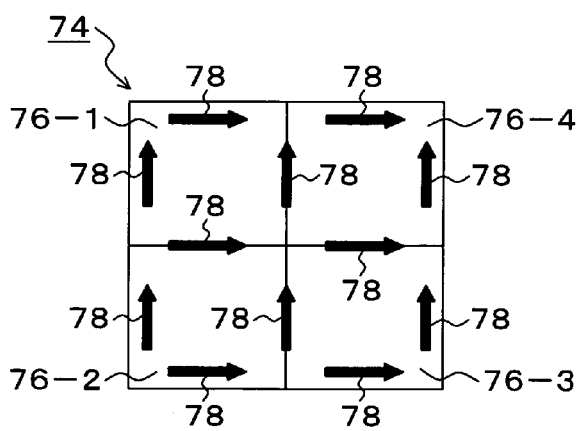
Figure 8C:
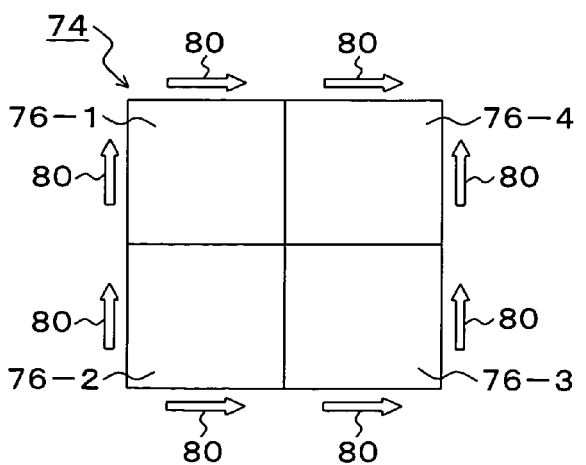

FIGS. 8A to 8C are explanatory diagrams showing setting of unknown values with respect to non-micro-magnetization regions including boundaries in a case in which the finite element method and the boundary element method are used in equations of a steady or an unsteady magnetic field.

FIG. 8A shows a magnetic substance 74 divided into four minute elements 76-1 to 76-4 as an analysis object model; wherein, as unknown values obtained by the equations of the magnetic fields, unknown values of vector potentials A obtained by first simultaneous equations discretized by the finite element method are disposed at the sides of the minute elements 76-1 to 76-4 as shown by arrows 78, and, at the same time, unknown values of magnetic field vectors H obtained by second simultaneous equations in which magnetic field equations are discretized by the boundary element method are set as shown by arrows 80 at the sides of the boundaries of the elements that are in contact with surrounding air regions among the minute elements 76-1 to 76-4.

FIGS. 8B and 8C separately show disposal of the vector potentials obtained by the finite element method and the magnetic field vectors H obtained by the boundary element method with respect to the sides of the minute elements 76-1 to 76-4 of FIG. 8A. FIG. 8B shows disposal of the vector potentials which are unknown values in the finite element method, and the vector potentials A shown by the arrows 78 are disposed at all the sides including boundaries which are in contact with surrounding air regions and internal boundaries.

Figure 9:
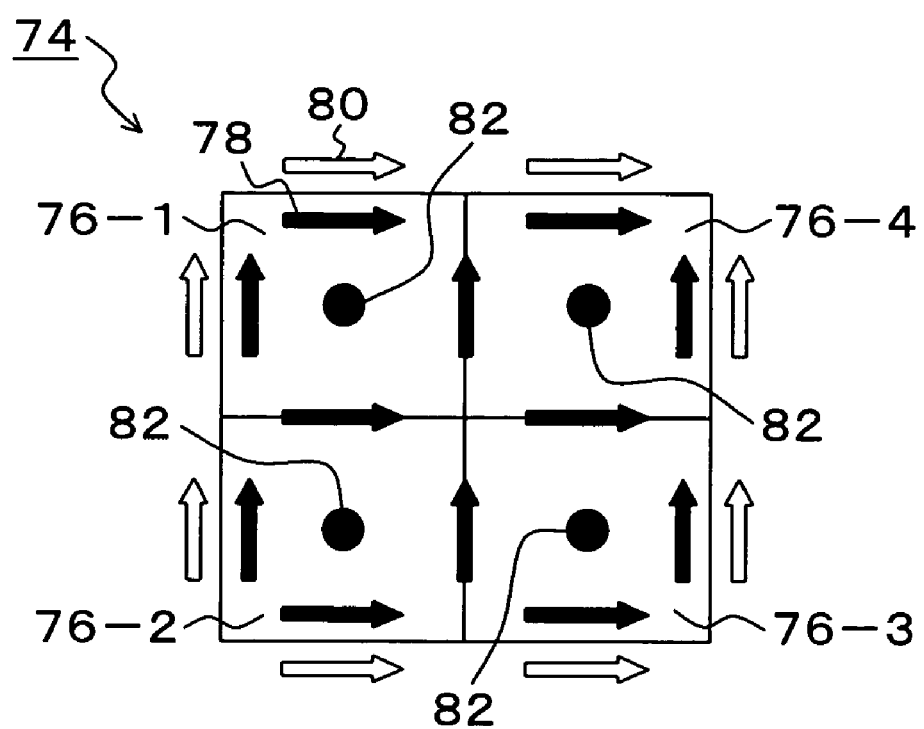
FIG. 9 is an explanatory diagram showing disposal of unknown values with respect to a micro-magnetization region including boundaries.

On the other hand, the unknown values 80 of the magnetic field vectors H obtained by the boundary element method in FIG. 8C are disposed merely at the sides which are in contact with the air regions outside the magnetic substance 74. Generation and solution of the simultaneous equations based on disposal of the vector potentials A which are unknown values of the finite element method onto all the sides and setting of the magnetic field vectors H which are unknown values of the boundary element method onto the sides of the boundary surfaces with respect to the magnetic substance 74 shown in FIGS. 8A to 8C will be further elucidated in the later description. Referring again to FIG. 6, when the entire magnetic distribution, that is, the magnetic field distribution of all the minute elements in the analysis object model of FIG. 7 is calculated in the calculation by means of generation and solution of the simultaneous equations using the finite element method and the boundary element method according to the equations of the magnetic field in step S4, in step S5, calculation of the motion of the micro-magnetization is executed by a solution according to the LLG equation with respect to, for example, the minute elements of the micro-magnetization region 72 in the vertical recording head 64 of FIG. 7. More specifically, a time integral of the LLG equation is obtained wherein the magnetic field distribution calculated in step S4 serves as an external magnetic field of micro-magnetization in the LLG equation. In calculation of the time integral of the LLG equation, in the present embodiment, as shown in FIG. 9, micro-magnetization 82 which is an unknown value M obtained by the LLG equation is disposed at the center of each of the minute elements 76-1 to 76-4, and the time integral of the LLG equation is obtained by using the finite volume method in discretization of the LLG equation. Herein, the LLG equation describing motion of a micro-magnetization vector m is provided by the following expression.

$$\frac{\partial \vec{m}}{\partial t} = -\gamma \vec{m} \times \vec{H} + \alpha \left( \vec{m} \times \frac{\partial \vec{m}}{\partial t} \right) \quad (\gamma : \text{friction coefficient}) \qquad (4)$$

wherein, H is an effective magnetic field,
γ is a friction coefficient, and
α is a constant dependent on a fictional frequency (magnetogyric ratio).

Subsequently, in step S6, whether the micro-magnetization obtained as a time integral of the LLG equation satisfies the convergence condition or not is determined. While the micro-magnetization vector m precesses in the vicinity of the effective magnetic field, the energy as a whole converges to a stable state under influence of, for example, the magnetic field due to exchange interaction of an external magnetic field or other micro-magnetization; and, this convergence of the stable state is determined in step S6. Specifically, when magnitude of temporal percentage change of the micro-magnetization vector m is smaller than a predetermined threshold value, it is determined to have converged. If the convergence condition is not satisfied in step S6, correction of an element matrix in the magnetic field equations is performed in step S7; and calculation time t is incremented merely by Δt subsequently in step S8, and the process from step S4 is repeatedly performed again until the convergence condition is satisfied in step S6. When the convergence condition is satisfied in step S6, the process proceeds to step S9 wherein the magnetic field is calculated and saved as result data.

Figure 10:
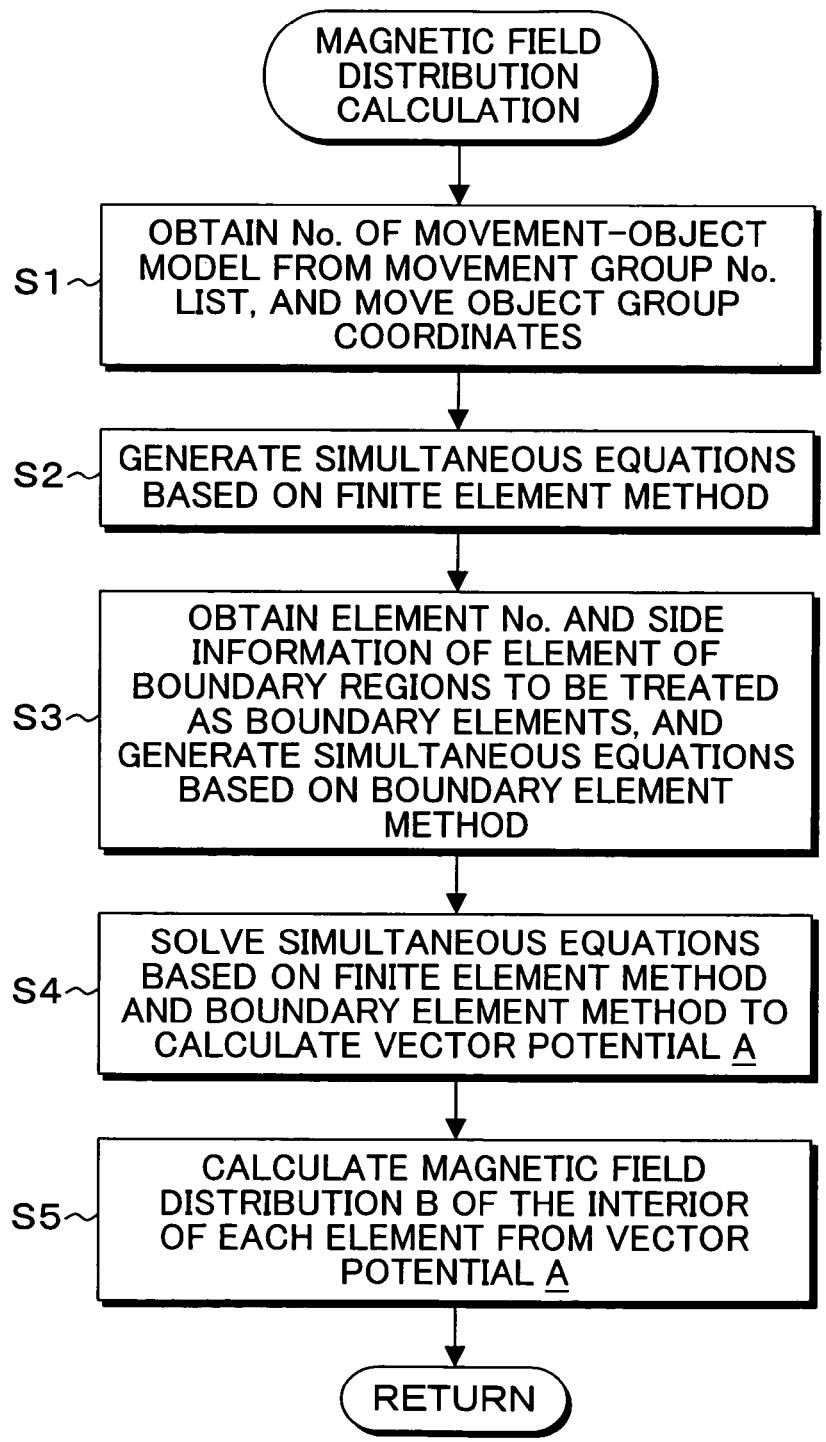
FIG. 10 is a flow chart of a magnetic field distribution calculation in step S4 of FIG. 6.

FIG. 10 is a flow chart of a detailed process of the magnetic field distribution calculation in step S4 of FIG. 6. In the magnetic field distribution calculation of FIG. 10, in step S1, the number of a moving object, that is, a model serving as a moving object, for example, the recording medium 68 in the analysis object model of FIG. 7 is obtained from a group number list, and the coordinates of the moving object group is moved. The amount of coordinate change dX used in the coordinate movement is obtained as dX=V×dt. Subsequently, in step S2, the finite element method is used in discretization of the steady or unsteady magnetic field equations to generate simultaneous equations based on the finite element method. In the generation of the simultaneous equations based on the finite element method, unknown values of vector potentials obtained by the simultaneous equations are disposed on the sides of all the minute regions constituting the model to be analyzed like the vector potentials 78 as shown in FIG. 8B. Subsequently, in step S3, element numbers and side information of the elements of boundary regions treated as boundary elements are obtained, and simultaneous equations based on the boundary element method are generated. In disposal of unknown values of the magnetic vectors H obtained by the simultaneous equations of this case based on the boundary element method, as shown in FIG. 8C, they are disposed on the sides that are in contact with boundaries of element numbers positioned at boundary regions like the magnetic field vectors 80. Subsequently, in step S4, the simultaneous equations based on the finite element method and the boundary element method are solved to calculate the respective vector potentials A of the elements. Furthermore, in step S5, magnetic field distribution B in each element is calculated from the vector potential A, and the process returns to the main routine of FIG. 6. Details of the process of calculating the magnetic field distribution by using the finite element method and the boundary element method in discretization of the equations of the steady or unsteady magnetic field from step S2 to S5 of FIG. 10 will be described as the following. When the equations of the magnetic fields of the present embodiment are to be solved, discretization has to be performed by means of the finite element method and the boundary element method to generate simultaneous equations. In the unsteady magnetic field equations provided by the expressions (1) and (2), if a scalar potential $\phi=0$ and the magnetic field derivative of the vector potential A is 0, the steady magnetic field equation of the expression (3) is obtained. Therefore, a discretization method of the expressions (1) and (2) serving as the unsteady magnetic field equations which are rather general will be described below. In the finite element method, both sides of the expressions (1) and (2) are respectively multiplied by a vector weighting function of an arbitrary shape and a scalar weighting function, and are changed in the manner described below.

$$\iiint_V \vec{N} \cdot \left\{ \vec{\nabla} \times (v\vec{\nabla} \times \vec{A}) - \vec{J}_0 + \sigma\left(\frac{\partial \vec{A}}{\partial t} + \vec{\nabla}\phi\right) - v_0 \vec{\nabla} \times \vec{M} \right\} dV = 0 \quad (5)$$

$$\iiint_V N \vec{\nabla} \cdot \left\{ -\sigma\left(\frac{\partial \vec{A}}{\partial t} + \vec{\nabla}\phi\right) \right\} dV = 0 \quad (6)$$

When the divergence theorem of Gauss is used in the expression (5), the following expression is obtained.

$$\iiint_V \left\{ (\vec{\nabla} \times \vec{N}) \cdot (v\vec{\nabla} \times \vec{A}) - \vec{N} \cdot \vec{J}_0 + \vec{N} \cdot \sigma\left(\frac{\partial \vec{A}}{\partial t} + \vec{\nabla}\phi\right) - \vec{N} \cdot v_0 \vec{\nabla} \times \vec{M} \right\} dV - \iint_S \vec{N} \cdot \{(v\vec{\nabla} \times \vec{A}) \times \vec{n}\} dS = 0 \quad (7)$$

Herein,
according to $$\vec{H} = v\vec{\nabla} \times \vec{A},$$

$$\iiint_V \left\{ (\vec{\nabla} \times \vec{N}) \cdot (v\vec{\nabla} \times \vec{A}) - \vec{N} \cdot \vec{J}_0 + \vec{N} \cdot \sigma\left(\frac{\partial \vec{A}}{\partial t} + \vec{\nabla}\phi\right) - \vec{N} \cdot v_0 \vec{\nabla} \times \vec{M} \right\} dV - \iint_S \vec{N} \cdot (\vec{H} \times \vec{n}) dS = 0 \quad (8)$$

is obtained. This equation is expressed by a matrix with respect to the unknown values A, $\phi$, H in the following manner.

$$[P1 \ P2 \ P3] \begin{bmatrix} A_{n+1} \\ \phi \\ H \end{bmatrix} = B_1(A_n) \quad (9)$$

A of the left side is $A_{n+1}$ of the current time step, and A of the right side is $A_n$ of the time of a step that is one step before that. Moreover, the term of the right side includes an excitation current Jo and the value of fixed A. Subsequently, when the divergence theorem of Gauss is used in the expression (2), the following expression is obtained.

$$-\iiint_V \vec{\nabla} N \cdot \left\{ \sigma\left(\frac{\partial \vec{A}}{\partial t} + \vec{\nabla}\phi\right) \right\} dV + \iint_S N \left\{ \sigma\left(\frac{\partial \vec{A}}{\partial t} + \vec{\nabla}\phi\right) \right\} \cdot \vec{n} dS = 0 \quad (10)$$

When the boundary used in the boundary element method is a boundary between the material and the air, the boundary integral term of the second term of the left side becomes 0 according to the principle of conservation of charge, and the following expression is obtained.

$$-\iiint_V \vec{\nabla} N \cdot \left\{ \sigma\left(\frac{\partial \vec{A}}{\partial t} + \vec{\nabla}\phi\right) \right\} dV = 0 \quad (11)$$

When this equation is expressed as a matrix with respect to the unknown values A, $\phi$, the following is obtained.

$$[R1 \ R2] \begin{bmatrix} A_{n+1} \\ \phi \end{bmatrix} = B_2(A_n) \quad (12)$$

When the boundary integral equation of a magnetic filed H of the following expression is applied to a region of an external boundary surface of the finite element method model, the entire magnetic field distribution of separated finite element method regions is calculated.

$$Cp(x)Hp(x) = \iint_S (\vec{H}(x') \times \vec{n}) \times \vec{\nabla} G(x,x') dS' - \iint_S (\vec{H}(x') \cdot \vec{n}) \vec{\nabla} G(x,x') dS' \quad (13)$$

"H×n" of the first term of the right side of the expression (13) corresponds to the value of the second term of the left side of the expression (8), and a magnetic field vector H of a boundary in-plane component is used in this term. The second term of the right side of the expression (13) uses a magnetic field component vertical to the boundary plane in accordance with "H·n". Therefore, a vertical component of the magnetic field in the boundary plane:

$$H_\perp = \nu \int\!\int_S B\,dS = \nu \int\!\int_S (\nabla \times A)\,dS = \nu \sum_i A_i dl_i$$

is substituted into the expression (13), and when they are expressed in a matrix with respect to the unknown values A, H, the following is obtained.

$$[R1\ \ R3]\begin{bmatrix} A \\ H \end{bmatrix} = 0 \tag{14}$$

When the expressions (9), (12), and (14) are expressed by one matrix, it will be as the following.

$$\begin{bmatrix} P1 & P2 & P3 \\ Q1 & Q2 & 0 \\ R1 & 0 & R3 \end{bmatrix} \begin{bmatrix} A_{n+1} \\ \phi \\ H \end{bmatrix} = \begin{bmatrix} B_1(A_n) \\ B_1(A_n) \\ 0 \end{bmatrix} \tag{15}$$

In the unsteady magnetic field calculation, the above expressions are solved in each time step to calculate the transitional vector potential A, thereby calculating a magnetic flux density $\vec{B} = \vec{\nabla} \times \vec{A}$.

Meanwhile, in the steady magnetic field calculation, the entire matrix can be described by the following expression, and the entire magnetic field distribution is calculated by one time of simultaneous equation calculation.

$$\begin{bmatrix} P1' & P3' \\ R1' & R3' \end{bmatrix} \begin{bmatrix} A \\ H \end{bmatrix} = \begin{bmatrix} B_1 \\ 0 \end{bmatrix} \tag{16}$$

Figure 11A:
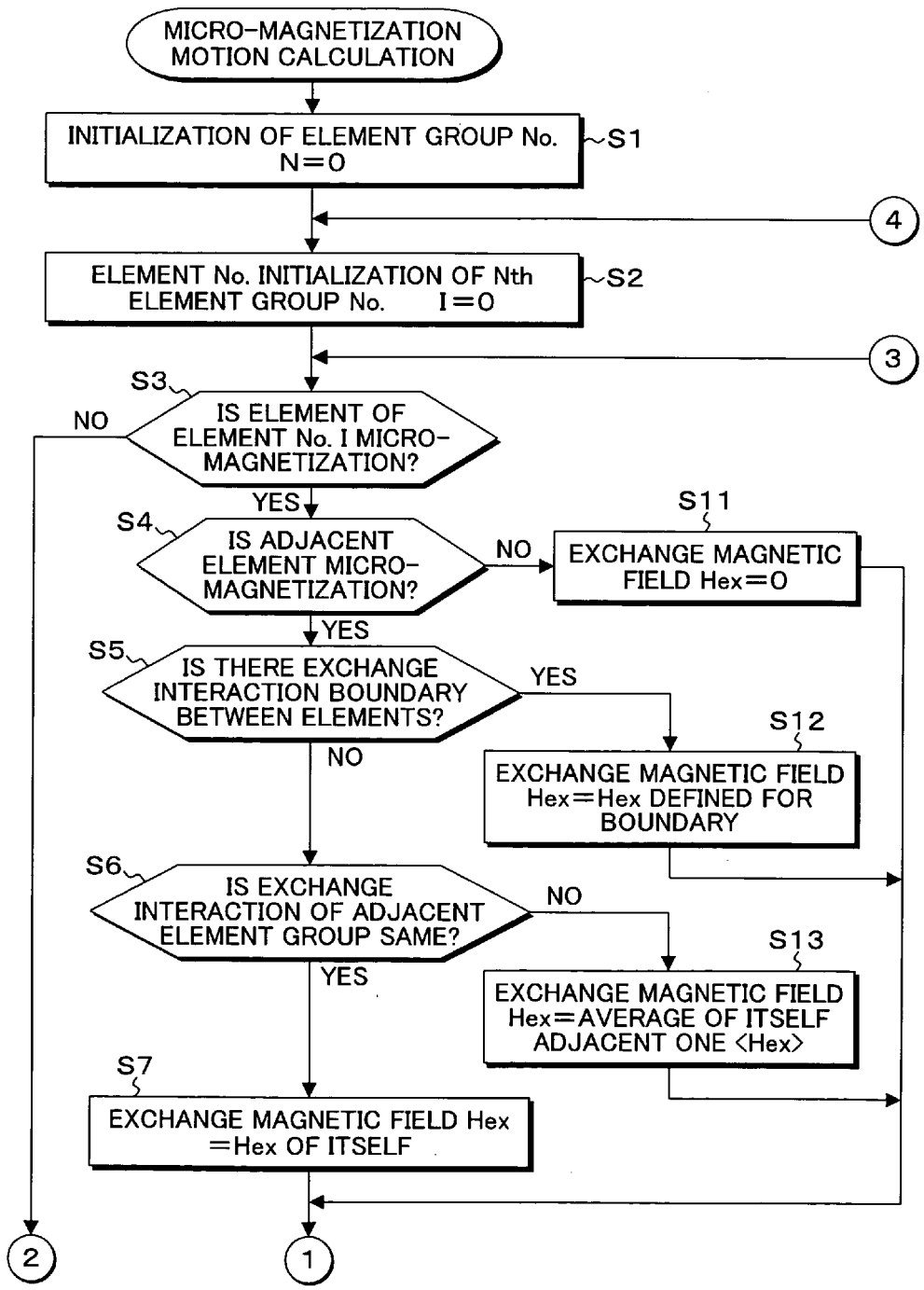
FIGS. 11A and 11B are flow charts of a micro-magnetization motion calculation in step S5 of FIG. 6.
Figure 11B:
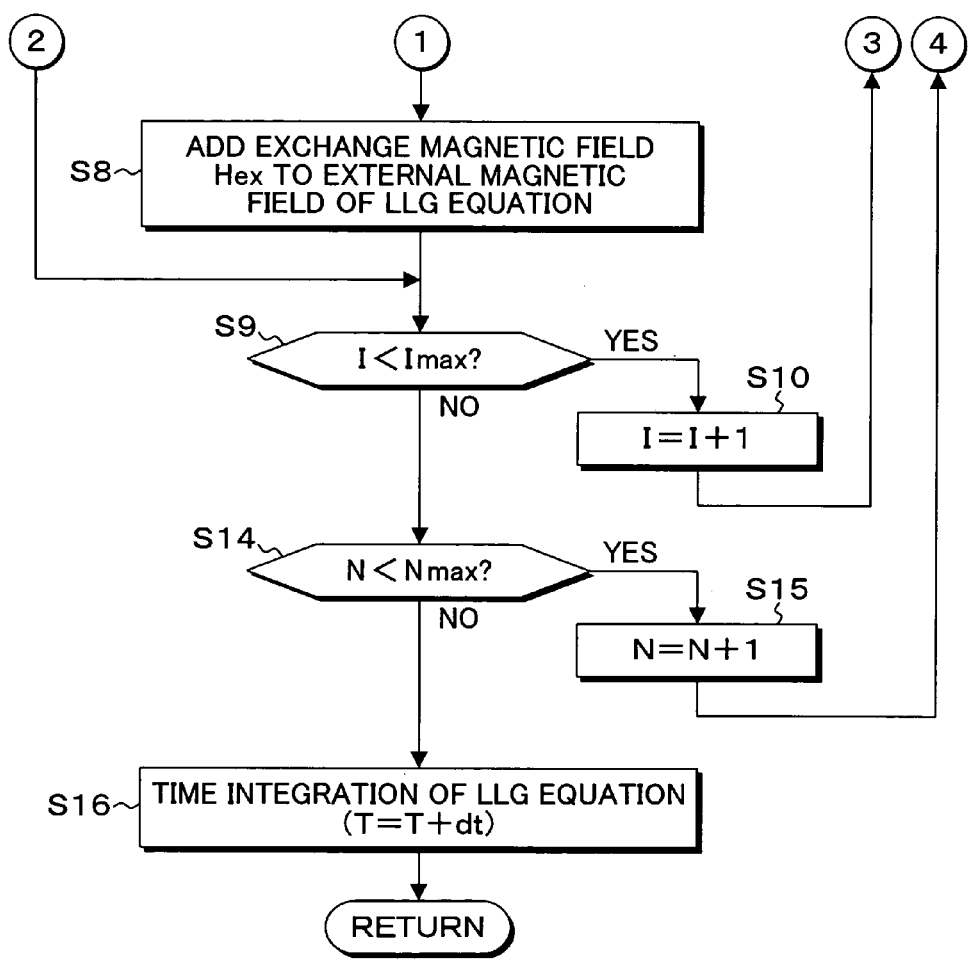

Herein, $B_1$ includes the excitation current $J_0$ and the value of fixed A. FIGS. 11A and 11B are flow charts of a detailed process of the micro time motion calculation in step S5 of FIG. 6. This process is a process in which time integration is performed for each range of the time step Δt described in FIG. 6 of the precession movement equation describing the motion of micro-magnetization, that is, the LLG equation. Herein, before actually obtaining the time integral of the LLG equation, a process for obtaining the value of an exchange magnetic field Hex caused by an exchange interaction received from an adjacent element for each element or a each element group and setting the value thereof as one term of the effective magnetic field of the LLG equation is performed; and then, the time integration is executed.

In FIGS. 11A and 11B, in the first place, the group number N of element groups is initialized to N=0 in step S1, the number I of an element in an Nth element group is initialized to I=0 in step S2, and whether the element of the element number I is micro-magnetization or not, that is, whether micro-magnetization M is allocated to the center of the element or not is determined in step S3. When it is allocated thereto, whether an adjacent element is micro-magnetization or not is determined in step S4; and, if it is micro-magnetization, a process of obtaining an exchange magnetic field Hex caused by an exchange interaction is performed in step S5 and thereafter. In step S5, whether there is a boundary of an exchange interaction or not between the element of the number I which is an object of the current process and an adjacent element is determined. For example, when a simulation is to be performed with the part between the two elements serving as a boundary of a crystal, an exchange interaction boundary corresponding to the crystal boundary is set; however, if there is no crystal boundary, in step S6, in order to simplify the process, whether an exchange interaction coefficient set to correspond to the element group is the same or not is determined. More specifically, in step S6, whether or not the element of the number I and the adjacent element have the same coefficient of exchange interactions with respect to the element groups is determined, for example, if they belong to different element groups. If the coefficients are the same in the adjacent element groups, the coefficient of an interaction of the element per se of the number I is used as the coefficient of the exchange interaction caused by the adjacent element in step S7, and an exchange magnetic field Hex in an effective magnetic field Heff of the LLG equation is added in step S8. Herein, the exchange magnetic field caused by the exchange interaction from the adjacent element can be obtained by multiplying a difference between the two magnetization vectors, that is, the magnetization vector allocated to the adjacent element and the magnetization vector allocated to the element per se by the coefficient of the exchange magnetic field Hex of the exchange interaction caused by the adjacent element. Meanwhile, if it is determined that no micro-magnetization is allocated to the element of the element number I in step S3; whether the element number I in the group is less than a maximum value Imax thereof or not is determined in step S9; and if it is less than that, the value of I is incremented in step S10, and the process from step S3 is repeated. If it is determined that no micro-magnetization is allocated to the adjacent element in step S4, since no exchange interaction is exerted by the adjacent element, the coefficient of the interaction is set to 0 in step S11, and the process is changed to the process of step S8. Herein, the exchange magnetic field Hex is 0. If it is determined that there is a boundary of an exchange interaction between the elements in step S5, the value of the coefficient defined for the boundary is set as the coefficient of the exchange interaction from the adjacent element in step S12. For example, when the boundary is that corresponding to a crystal boundary, a simulation can be performed with the boundary serving as the boundary of the crystal by setting the value of the coefficient somewhat low. Then, in step S8, the exchange magnetic field Hex obtained by using the value of the coefficient is used as an exchange magnetic field of the LLG equation. The exchange interaction is, originally, an interaction between electrons dependent on the direction of the spin derived from the coulombic interaction and the Pauli principle; and the more minute the elements, the larger the influence thereof. The exchange interaction has, for example, an action of aligning the direction of the micro-magnetization vectors between the element groups; and, if the exchange interactions are uniform, the variation is continuous even if the directions of the micro-magnetization vectors are varied. Therefore, when the coefficient of the exchange interaction is reduced as described above, in other words, the action is diminished, a simulation in which the part between the elements serves as a crystal boundary can be performed. Inversely, ferromagnetic coupling can be expressed when the coefficient is increased, and diamagnetic coupling can be expressed when the coefficient is caused to be negative. Then, in step S6 when it is determined that the exchange interactions between the adjacent element groups are not the same; and, in step S13, a mean value of the interaction coefficients of the element, i.e., the element of the number I and the adjacent element is obtained, and the value is used as the coefficient of the interaction, thereby obtaining the value of the exchange magnetic field Hex added in step S8. When the element number I in the element group is determined to have reached the maximum value Imax in step S9, whether the element group number N is less than the maximum value Nmax or not is determined in step S14; and, if it is less than that, after the value of N is incremented in step S15, the process from step S2 is repeated. Then, when the value of N is determined to have reached the maximum value in step S14, a time integral of the LLG equation is actually obtained in step S16, and the process returns to the main routine of FIG. 6.

FIGS. 12A to 12C are explanatory diagrams of micro-magnetization analysis of the present embodiment which is performed while a recording medium is directly moved. FIG. 12A is an initial position of the micro-magnetization analysis, and shows the analysis object model shown in FIG. 7 in a simplified manner; wherein the vertical recording head 64 of the stationary side has the magnetic pole 65 and the coil 66, and the moving side is the recording medium 68. When calculation of the micro-magnetization in the micro-magnetization region 72 at the initial position of FIG. 12A is finished, based on a moving velocity set for the recording medium 68, a movement distance L1 is calculated by a coordinate calculation of a movement position by a next analysis step, the recording medium 68 moves relative to the vertical recording head 64 side, and, in this state, second micro-magnetization analysis is performed to obtain the micro-magnetization of the micro-magnetization region 72.

Furthermore, as shown in FIG. 12C, a movement distance L2 is calculated from the moving velocity in a next time step, it is moved based on the calculation of a coordinate position of the recording medium 68, and, in this state, the micro-magnetization of the micro-magnetization region 72 of the vertical recording head 64 is obtained. As described above, in the present invention, when an analysis object model is once generated as shown in FIG. 12A, thereafter, transitional change of, for example, a magnetic field generated from the magnetic pole of the recording magnetic head along with movement of the recording medium 68 can be continuously obtained by moving the position of the moving side along with passage of time and by repeating the calculation process of the micro-magnetization analysis again for each movement position.

Figure 13:
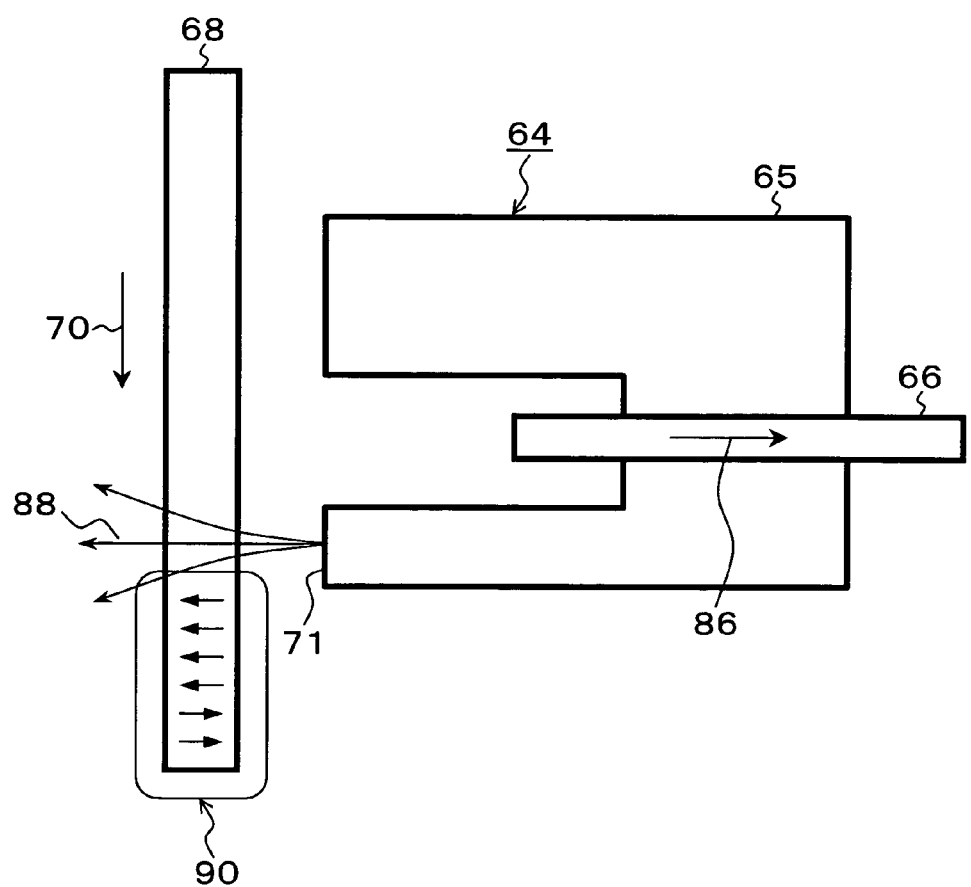
FIG. 13 is an explanatory diagram of a model for recording calculation of a hard disk drive subjected to micro-magnetization analysis according to the present invention.

FIG. 13 is an explanatory diagram of a model for recording calculation of a hard disk drive subjected to micro-magnetization analysis according to the present embodiment. Regarding the model of FIG. 13 for recording calculation, as shown in FIG. 7, shape data of the vertical recording head 64 composed of the magnetic pole 65 and the coil 66 and record data of the recording medium 68 is read, wherein the shape data of each of them is composed of minute elements caused by mesh division, and a recording process performed by the vertical recording head 64 is simulated while the recording medium 68 is being moved. More specifically, when a current is caused to flow through the coil 66, a simulation of recording a recording magnetization pattern 90 onto the recording medium 68, from the magnetic pole surface 71 of the magnetic pole 65 exerted at the vertical recording head 64 toward the recording medium 68, can be executed.

Figure 14:
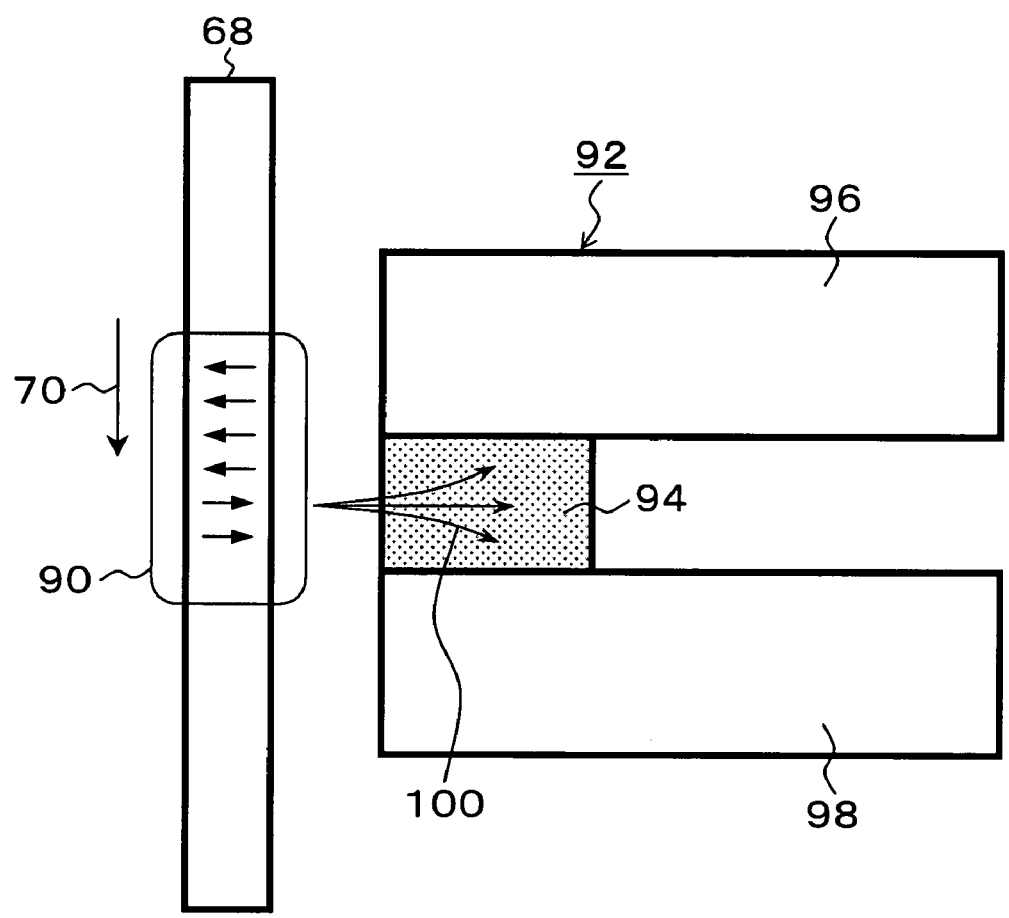
FIG. 14 is an explanatory diagram of a model for reproducing calculation of a hard disk drive which is subjected to micro-magnetization analysis according to the present invention.

FIG. 14 is an explanatory diagram of a calculation model for reproduction of a hard disk drive which is subjected to micro-magnetization analysis according to the present embodiment. With respect to the calculation model of FIG. 14 for reproduction, as an analysis object model, shape data of a reproducing head 92 composed of a read element 94, an upper shield 96, and a lower shield 98 and shape data of the recording medium 68 is read, and a reproduction process is simulated while the recording medium 68 side is being moved. In the reproducing head 92, the read element 94 is present in a region sandwiched between the upper shield 96 and the lower shield 98. Leakage magnetic flux 100 from the recording magnetization pattern 90 of the recording medium 68 which is present immediately below the read element 94 is read by the read element 94. The recording magnetization pattern 90 has been set as an input condition by reading the recording magnetization pattern 90 which has been recorded to the recording medium 68 in the simulation of the model of FIG. 13 for recording calculation; therefore, magnetic analysis considering interactions between the recording head and the recording medium, and the recording medium and the reproducing head can be realized according to the magnetic analysis of FIG. 13 and FIG. 14.

FIGS. 15A and 15B are dialogue 102 for analysis condition setting for an element group. In the dialogue 162 of FIGS. 15A and 15B for analysis condition setting, an item 104 specifies an element group ID by which elements are grouped in a unit of the same material, an item 106 specifies the name of the element group, and material selection of an item 108 specifies a material for the element group. Herein, "NO SETTING" sets that this element group is not used in calculation, "AIR" sets that it is a region of air, "CONDUCTOR" sets that it is a region through which a current can flow, "MAGNETIC SUBSTANCE" sets that it is a region through which a current can flow and which is treated as a magnetic substance, and "MICRO-MAGNETIZATION" sets that it is a region through which a current can flow and to which micro-magnetization is allocated. An excitation current of an item 110 sets it as an element through which a current that generates a magnetic field flows. Non-linear of an item 112 sets the magnetic property of the magnetic substance as a B-H curve or an M-H curve. Magnetizing of an item 114 sets, for example, micro-magnetization properties, i.e., the magnitude and direction thereof by adding a magnetic field of a certain direction from outside before calculation. An item 116 fixes magnetization for quasi-stationary calculation. In other words, it sets that micro-magnetization calculation is to be executed merely for the group specified by the ID of an item 126. An item 118 sets magnetic permeability, an item 120 sets a dielectric constant, an item 122 sets the magnitude of magnetizing in the magnetizing of the item 114, and an item 124 sets X, Y, and Z components of magnetizing. With an ID for quasi-stationary calculation of the item 126, micro-magnetization calculation is executed merely when this region ID is called. With the magnetizing intensity division number of an item 128, magnetizing intensity is increased/reduced over 2N+1 times with respect to the division number of magnetizing intensity to perform micro-magnetization analysis. For example, it corresponds to the step number of magnitude of magnetizing intensity in a case in which magnetizing intensity is started from a small value in initial analysis, it is gradually increased in next analysis, and, after it reaches a maximum value, micro-magnetization analysis is repeated while reducing the magnetizing intensity. Micro-magnetization variables of items 130 are regions for setting variables for determining the properties of micro-magnetization, wherein "AXIS OF EASY MAGNETIC FIELD" specifies a magnetic field of a direction of an axis of easy magnetization caused by magnetic anisotropy, "EXCHANGE COEFFI- CIENT" specifies an exchange interaction coefficient, "MAGNETIZATION INTENSITY" specifies intensity of micro-magnetization, and "FRICTION COEFFICIENT" specifies the value of a friction coefficient in the LLG equation. The direction of easy axis of an item 132 sets the direction of an axis of easy magnetization, and the direction thereof is random or specified in an aligned direction. The initial magnetization vector direction of an item 134 sets the direction of an initial magnetization vector as X, Y, and Z components, and there are a case of "MAGNETIZING" and a case of "FORCIBLE" specification. The setting of a magnetic film of an item 136 specifies a magnetic film for calculating output, and a joining film of an item 138 sets properties of a material for joining a magnetic film to a magnetic film, however, they are not directly related to the present embodiment.

FIG. 16 is a dialogue 140 for element boundary condition setting. In FIG. 16, in the dialogue 140 for element boundary condition setting, a boundary for magnetic field calculation of an item 142 is set by selecting "NO SETTING", "EXTERNAL BOUNDARY", "SYMMETRICAL BOUNDARY", or "POTENTIAL BOUNDARY". As a boundary for excitation current of an item 144, "ELECTRIC POTENTIAL SPECIFICATION" OR "CURRENT SPECIFICATION" is selected and a value is input. An exchange magnetic field action of an item 146 sets an exchange interaction. For example, with respect to a boundary, the exchange interaction is inversely proportional to the square of the distance between the elements; therefore, the coefficient dependent on the size of the element can be also set, or the value of the exchange magnetic field can be directly set instead of the value of the coefficient. When setting of the exchange interaction is performed with respect to the element boundary herein, the setting is prioritized than the setting in FIGS. 15A and 15B with respect to the element group. An item 148, an item 150, and an item 152 are for inputting potentials, wherein components Ax, Ay, and Az of the vector potential A, a scalar potential $\phi$, and a magnetic potential $\phi$m are input. An item 154 is for fixing a magnetization vector, wherein, for example, when an X direction is fixed, merely a Y component and a Z component of the micro-magnetization vector m are changed. An ID for quasi-stationary calculation of an item 156 represents that a boundary for an excitation current is effective merely when the boundary of the ID specified herein is called. When various setting, for example, a magnetic field of a direction of easy axis, etc. are set for an element group or an element boundary in the above described manner, analysis which is variable and accurate compared with a conventional method using the B-H curve can be performed. In the present embodiment, a micro-magnetization analysis program according to the present invention and a computer serving as a magnetization analysis apparatus for executing it have been described; however, the present invention can further provide a computer-readable recording medium storing the micro-magnetization analysis program. Examples of the computer-readable recording medium storing the micro-magnetization analysis program of the present invention include: portable recording media such as a CD-ROM, a floppy disk (R), a DVD disk, a magneto-optical disk, and an IC card; storage devices such as hard disk HDDs provided in and outside a computer system; a database or another computer system and a database thereof retaining the program via a line; and a transmission medium on a line. Moreover, although micro-magnetization analysis of a recording head and a reproducing head of a hard disk drive have been taken as an example in the present embodiment, the present invention is not limited thereto and can be applied, without modification, to magnetization analysis of arbitrary magnetic substances, particularly, to a model having one or a plurality of a stationary side and a moving side as magnetic substances of the analysis object model. Moreover, the above described embodiment takes, as an example, the case in which vector potentials and magnetic field vectors, which are unknown values of the simultaneous equations with respect to minute elements obtained by dividing, into a mesh, a magnetic substance region of a case in which the finite element method and the boundary element method are used in discretization of steady or unsteady equations, are disposed on the sides of the minute elements; however, the unknown values may be allocated to the vertices (nodes) of the minute elements so as to generate/solve the simultaneous equations. Moreover, the present invention includes arbitrary modifications that do not impair the object and advantages thereof and is not limited by the numerical values shown in the above described embodiment.

What is claimed is:

1. A computer-readable storage medium which stores a micro-magnetization analysis program characterized by causing a computer to execute operations, comprising:

inputting an analysis object model in which merely regions of a first magnetic substance fixed in a space to be analyzed and a second magnetic substance to be moved are subjected to mesh-division into minute elements and analysis conditions including a material property, a moving velocity, a time step;

generating a first magnetic field equation by use of the finite element method in a state in which unknown values are disposed on sides of all the minute elements of the first magnetic substance and the second magnetic substance and generating a second magnetic field equation by use of the boundary element method in a state in which unknown values are disposed on the sides of boundaries of the minute elements of the first magnetic substance and the second magnetic substance which are in contact with space;

obtaining vector potentials of the sides of the minute elements by solving simultaneous equations based on the first magnetic field equation and the second magnetic field equation;

obtaining magnetic field distribution in each of the elements from the vector potentials;

obtaining micro-magnetization by time integration of an LLG equation wherein the magnetic field distribution obtained in the magnetic field calculating step serves as an external magnetic field with respect to the LLG equation in a state in which an unknown value of the micro-magnetization is disposed at the center of each of the minute elements included in a specified micro-magnetization region of the first magnetic substance and/or the second magnetic substance; and if a convergence condition of the micro-magnetization is not satisfied, correcting the first magnetic field equation and the second magnetic field equation by use of the micro-magnetization to increase time stepwise, and then, repeating the process of the simultaneous equation generating and the processes following until the convergence condition is satisfied;

and displaying results of said correcting on a computer screen.

2. The micro-magnetization analysis program described in claim 1 characterized in that the magnetic field equation of the finite element method in the simultaneous equation generating is an unsteady equation.

3. The storage medium according to claim 1 characterized in that the magnetic field equation of the finite element method in the simultaneous equation generating is a steady equation.

4. The storage medium according to claim 1 characterized in that the unknown values in the simultaneous equation generating are disposed on the sides and nodes of the minute elements and the center of each element.

5. The storage medium according to claim 1 characterized by further executing movement-object moving analyzing transitional change of the micro-magnetization by repeating the process of the simultaneous equation generating and the processes following while moving the second magnetic substance in an arbitrary direction based on the moving velocity.

6. The storage medium according to claim 1 characterized in that, in the inputting, the second magnetic substance to be moved is selected from a model shape display screen or a model name list, and an initial position and the moving velocity are set.

7. The storage medium according to claim 1 characterized in that, in the inputting, surfaces of the magnetic substances are set as regions automatically treated by the boundary element method.

8. The storage medium according to claim 1 characterized in that, in the inputting, a boundary surface to be treated by the boundary element method is arbitrarily selected from a display screen of magnetic substance shape or a list of boundary names and set.

9. The storage medium according to claim 1 characterized in that the fixedly-disposed first magnetic substance of the analysis object model is a recording head, the second magnetic substance to be moved is a recording medium, and transitional change of the micro-magnetization with respect to movement of the recording medium is analyzed wherein a recording magnetic pole region of the recording head and a recording medium region serve as micro-magnetization regions.

10. The storage medium according to claim 1 characterized in that the fixedly-disposed first magnetic substance of the analysis object model is a reproducing head, the second magnetic substance to be moved is a recording medium, and transitional change of the micro-magnetization with respect to movement of the recording medium is analyzed wherein a read element region of the reproducing head serves as a micro-magnetization region.

11. A micro-magnetization analysis method, comprising:
inputting an analysis object model in which merely regions of a first magnetic substance fixed in a space to be analyzed and a second magnetic substance to be moved are subjected to mesh-division into minute elements and analysis conditions including a material property, a moving velocity, a time step;
generating step of generating a first magnetic field equation by use of the finite element method in a state in which unknown values are disposed on sides of all the minute elements of the first magnetic substance and the second magnetic substance and generating a second magnetic field equation by use of the boundary element method in a state in which unknown values are disposed on the sides of boundaries of the minute elements of the first magnetic substance and the second magnetic substance which are in contact with space;
obtaining vector potentials of the sides of the minute elements by solving simultaneous equations based on the first magnetic field equation and the second magnetic field equation;
obtaining magnetic field distribution in each of the elements from the vector potentials;
obtaining micro-magnetization by time integration of an LLG equation wherein the magnetic field distribution obtained in the magnetic field distribution calculating step serves as an external magnetic field with respect to the LLG equation in a state in which an unknown value of the micro-magnetization is disposed at the center of each of the minute elements included in a specified micro-magnetization region of the first magnetic substance and/or the second magnetic substance; and
if a convergence condition of the micro-magnetization obtained in the micro-magnetization motion calculating unit is not satisfied, correcting the first magnetic field equation and the second magnetic field equation by use of the micro-magnetization to increase time stepwise, and then, repeating the process of the simultaneous equation generating and the processes following until the convergence condition is satisfied;
and displaying results of said correcting on a computer screen.

12. The method according to claim 11 characterized by further executing movement-object moving analyzing transitional change of the micro-magnetization by repeating the process of the simultaneous equation generating step and the processes following the step while moving the second magnetic substance in an arbitrary direction based on the moving velocity.

13. The method according to claim 11 characterized in that, in the inputting, the second magnetic substance to be moved is selected from a model shape display screen or a model name list, and an initial position and the moving velocity are set.

14. The method according to claim 11 characterized in that, in the inputting, surfaces of the magnetic substances are set as regions automatically treated by the boundary element method.

15. The method according to claim 11 characterized in that, in the inputting, a boundary surface to be treated by the boundary element method is arbitrarily selected from a display screen of magnetic substance shape or a list of boundary names and set.

16. The method according to claim 11 characterized in that the fixedly-disposed first magnetic substance of the analysis object model is a recording head, the second magnetic substance to be moved is a recording medium, and transitional change of the micro-magnetization with respect to movement of the recording medium is analyzed wherein a recording magnetic pole region of the recording head and a recording medium region serve as micro-magnetization regions.

17. The method according to claim 11 characterized in that the fixedly-disposed first magnetic substance of the analysis object model is a reproducing head, the second magnetic substance to be moved is a recording medium, and transitional change of the micro-magnetization with respect to movement of the recording medium is analyzed wherein a read element region of the reproducing head serves as a micro-magnetization region.

18. A micro-magnetization analysis apparatus, comprising:
an input unit inputting an analysis object model in which merely regions of a first magnetic substance fixed in a space to be analyzed and a second magnetic substance to be moved are subjected to mesh-division into minute elements and analysis conditions including a material property, a moving velocity, a time step;

a simultaneous equation generating unit generating a first magnetic field equation by use of the finite element method in a state in which unknown values are disposed on sides of all the minute elements of the first magnetic substance and the second magnetic substance and generating a second magnetic field equation by use of the boundary element method in a state in which unknown values are disposed on the sides of boundaries of the minute elements of the first magnetic substance and the second magnetic substance which are in contact with space;

a simultaneous equation solution unit obtaining vector potentials of the sides of the elements by solving simultaneous equations based on the first magnetic field equation and the second magnetic field equation;

a magnetic field calculating unit obtaining magnetic field distribution in each of the elements from the vector potentials;

a micro-magnetization state calculating unit obtaining micro-magnetization by time integration of an LLG equation wherein the magnetic field distribution obtained by the magnetic field calculating unit serves as an external magnetic field with respect to the LLG equation in a state in which an unknown value of the micro-magnetization is disposed at the center of each of the minute elements included in a specified micro-magnetization region of the first magnetic substance and/or the second magnetic substance; and a simultaneous equation correcting unit, if a convergence condition of the micro-magnetization obtained in the micro-magnetization motion calculating step is not satisfied, correcting the first magnetic field equation and the second magnetic field equation by use of the micro-magnetization to increase time stepwise, and then, repeating the process of the simultaneous equation generating step and the processes following the step until the convergence condition is satisfied.

19. The apparatus according to claim 18 characterized by further executing a movement-object moving unit for analyzing transitional change of the micro-magnetization by repeating the process of the simultaneous equation generating unit and the processes following the unit while moving the second magnetic substance in an arbitrary direction based on the moving velocity.

20. The apparatus according to claim 17 characterized in that, in the input unit, the second magnetic substance to be moved is selected from a model shape display screen or a model name list, and an initial position and the moving velocity are set.

* * * * *

UNITED STATES PATENT AND TRADEMARK OFFICE
CERTIFICATE OF CORRECTION

PATENT NO. : 7,236,899 B1 Page 1 of 1
APPLICATION NO. : 11/442978
DATED : June 26, 2007
INVENTOR(S) : Koichi Shimizu It is certified that error appears in the above-identified patent and that said Letters Patent is hereby corrected as shown below:

Col. 21, line 56, before "generating a", delete "generating step of".

Signed and Sealed this

Sixth Day of November, 2007

JON W. DUDAS
*Director of the United States Patent and Trademark Office*